United States Patent

Momose

(10) Patent No.: US 6,670,694 B2
(45) Date of Patent: Dec. 30, 2003

(54) SEMICONDUCTOR DEVICE

(75) Inventor: Hisayo Momose, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/916,506

(22) Filed: Jul. 30, 2001

(65) Prior Publication Data

US 2002/0185676 A1 Dec. 12, 2002

(30) Foreign Application Priority Data

May 31, 2001 (JP) ........................................ 2001-165581

(51) Int. Cl.$^7$ ........................ H01L 29/04; H01L 31/036; H01L 29/76; H01L 29/94; H01L 31/062; H01L 31/113; H01L 31/119; H01L 23/58
(52) U.S. Cl. ........................ 257/627; 257/628; 257/411; 257/496
(58) Field of Search .................. 257/327, 627, 257/628, 411, 496, 329, 330, 331

(56) References Cited

U.S. PATENT DOCUMENTS

| | | | | |
|---|---|---|---|---|
| 5,534,449 A | * | 7/1996 | Dennison et al. | 438/231 |
| 5,691,225 A | * | 11/1997 | Abiko | 438/199 |
| 5,811,336 A | * | 9/1998 | Kasai | 438/271 |
| 5,905,283 A | * | 5/1999 | Kasai | 257/334 |
| 5,990,516 A | | 11/1999 | Momose et al. | |
| 6,075,270 A | * | 6/2000 | Okihara et al. | 257/330 |
| 6,114,228 A | * | 9/2000 | Gardner et al. | 438/585 |

FOREIGN PATENT DOCUMENTS

| | | | |
|---|---|---|---|
| JP | 404256369 A | * 9/1992 | H01L/29/784 |
| JP | 8-78533 | 3/1996 | |
| JP | 8-213606 | 8/1996 | |

OTHER PUBLICATIONS

K. Noda et al., "0.1 um Delta–doped MOSFET Using Post Low–energy Implanting Selective Epitaxy", 1994 Sumposium on VLSI Tech. Diq. Of Techn Papers, pp. 19–20, (1994).

H. S. Momose et al., "Improvement of direct–tunneling gate leak age current in ultra–thin gate oxide CMOS with TiN gate electrode using non–doped selective epitaxial Si channel technique", 1999 International Electron Device Meeting, pp. 819–822, (1999).

C.H.J. Van Den Brekel, "Growth Rate Anisotropy and orphology of Autoepitaxial Silicon Films From $SiCl_4$", Journal of Crystal Growth 23, pp. 259–266, (1974).

H. Momose, "Semiconductor Device", U.S. patent application Ser. No. 09/163,434, filed Jun. 28, 2001.

T. Ohguro et al., "Silicon Epitaxy and Its Application to RF IC's", Electrochemical Society Proceedings vol. 99–18, 1999, pp. 123–141.

* cited by examiner

Primary Examiner—Steven Loke
Assistant Examiner—Samuel A Gebremariam
(74) Attorney, Agent, or Firm—Finnegan, Henderson, Farabow, Garrett & Dunner, L.L.P.

(57) ABSTRACT

A surface orientation other than a (100) surface orientation is exposed to the surface portion of a silicon substrate having the (100) surface orientation, for example. A silicon epitaxial growth layer is formed only on a region containing a channel forming region on the (100) surface orientation.

3 Claims, 19 Drawing Sheets

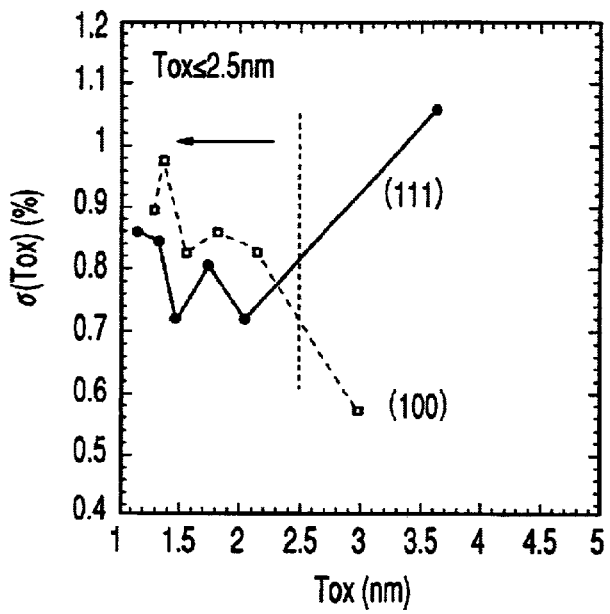
F I G. 16
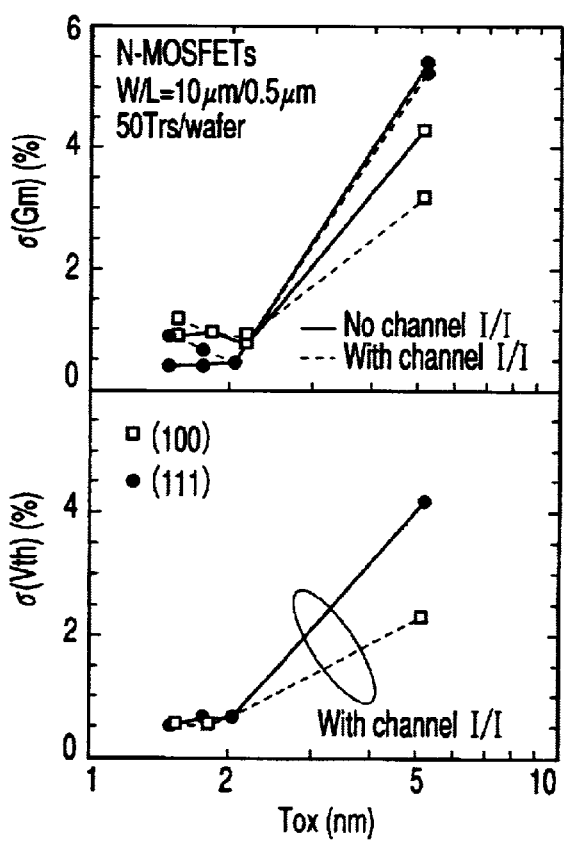
F I G. 17

SEMICONDUCTOR DEVICE

CROSS-REFERENCE TO RELATED APPLICATIONS

This application is based upon and claims the benefit of priority from the prior Japanese Patent Application No. 2001-165581, filed May 31, 2001, the entire contents of which are incorporated herein by reference.

BACKGROUND OF THE INVENTION

1. Field of the Invention

This invention relates to a semiconductor device and more particularly to a CMOS (Complementary Metal Oxide Semiconductor) device used in an LSI (Large Scale Integrated Circuit) of high performance and low power consumption, for example.

2. Description of the Related Art

For attaining the high performance of a CMOS device, the technique for forming a non-doped epitaxial silicon layer in the channel portion to form a field effect transistor (MOSFET) is already known (for example, K. Noda, T. Uchida, T. Tatsumi, T. Aoyama, K. Nakajima, H. Miyamoto, T. Hashimoto and I. Sasaki, "0.1 µm delta doped MOSFET using post low-energy implanting selective epitaxy," in Symp. VLSI Tech. Dig., pp. 19–20, 1994. (refer to reference document [1]), or T. Ohguro, H. Naruse, H. Sugaya, S. Nakamura, N. Sugiyama, E. Morifuji, H. Kimijima, T. Yoshitomi, T. Morimoto, H. S. Momose, Y. Katsumata and H. Iwai, "Silicon epitaxy and its application to RF IC's", Electrochemical society proceeding vol. 99-18, pp. 123–141, 1999. (refer to reference document [2])).

It is known that the transistor with the above structure enhances the driving power and has an excellent sub-threshold characteristic and is effective for lowering a gate leakage current which causes a problem in a fine MOSFET (for example, H. S. Momose, T. Ohguro, E. Morifuji, H. Sugaya, S. Nakamura, T. Yoshitomi, H. Kimijima, T. Morimoto, F. Matsuoka, Y. Katsumata, H. Ishiuchi and H. Iwai, "Improvement of direct-tunneling gate leakage current in ultra-thin gate oxide CMOS with TiN gate electrode using non-doped selective epitaxial Si channel technique", in IEDM Tech. Dig. pp 819–822, December, 1999. (refer to reference document [3]).

FIG. 22A and FIG. 22B show a method for manufacturing a transistor with the above structure by taking a conventional CMOS device as an example.

First, as shown in FIG. 22A, an element isolation region 102 is formed in the surface portion of a silicon substrate 101 having a normal (100) surface orientation so as to define element regions (N-type well region 103a, P-type well region 103b). After a silicon sacrificing oxide film (not shown) with a film thickness of 12 nm is formed on the surfaces of the N-type well region 103a and P-type well region 103b, arsenic and boron which are impurities are doped. Thus, a PMOS channel impurity doped region 104a and NMOS channel impurity doped region 104b are formed as channel portions each having a desired threshold voltage.

Then, after the silicon sacrificing oxide film is removed, a pre-heating process at 940° C. is effected as a pre-process for removing residual oxygen in the surface portion of the silicon substrate 101.

Next, silicon epitaxial growth layers (non-doped epitaxial silicon layers) 105a, 105b are respectively formed with a film thickness of approx. 30 nm on the PMOS channel impurity doped region 104a and NMOS channel impurity doped region 104b by use of $Si_2H_4Cl_2$ gas, for example, at the temperature of 800° C. by the reduced pressure chemical vapor deposition (RP-CVD) method. By effecting the above process, a channel portion having an extremely steep impurity concentration gradient is realized.

After this, as shown in FIG. 22B, the gate oxidation process is effected by a furnace oxidation method. By effecting the above gate oxidation process, oxide films used for respectively forming gate insulating films 106a, 106b with the preset film thickness are formed on the silicon epitaxial growth layers 105a, 105b. For example, if the gate oxidation process is effected in a condition of the temperature of 800° C. and the oxidizing time of 60 minutes, an oxide film with a film thickness of 5 nm can be formed. If the furnace oxidation method is used, the gate insulating films 106a, 106b with desired film thickness can be formed by adequately selecting the temperature and time.

Then, after a polysilicon film is deposited on the oxide film to a film thickness of approx. 250 nm, the polysilicon film and oxide film are patterned by anisotropic etching. Thus, gate electrodes 107a, 107b having desired gate length are respectively formed together with the gate oxide films 106a, 106b.

Next, after preset impurity is doped, the heat treatment is effected in a nitrogen atmosphere at the temperature of 1000° C. for 20 seconds, for example. By effecting the heat treatment, the impurities in the gate electrodes 107a, 107b are activated and shallow source/drain regions 108a, 108b are formed on the surface portion of the PMOS channel impurity doped region 104a and NMOS channel impurity doped region 104b.

After this, gate side wall portions 109a, 109b and deep source/drain regions 110a, 110b are formed. Thus, a PMOS transistor (P-type MOSFET) and NMOS transistor (N-type MOSFET) respectively having the silicon epitaxial growth layers 105a, 105b in the channel portions thereof are completed.

Then, silicide layers (not shown) are formed on the surface portions of the source/drain regions 110a, 110b and the gate electrodes 107a, 107b by the known technique. After thus lowering the resistance of each of the electrode portions, the electrode portions are connected to metal interconnections (not shown) via contact portions (not shown).

If the N-type MOSFET is formed on the substrate of the (100) surface orientation or if the P-type MOSFET is formed on the substrate of a surface orientation such as the (110) surface orientation other than the (100) surface orientation, it is known that excellent mobility can be attained.

From the above viewpoint, attempt was made to form a MOSFET having a silicon epitaxial growth layer in the channel portion on the substrate of a surface orientation other than the (100) surface orientation. As a result, as described before, it was proved that the reliability of the MOSFET having the silicon epitaxial growth layer in the channel portion was lower than the MOSFET formed on the substrate of the (100) surface orientation and the gate leakage current was increased in comparison with that of the latter MOSFET although it had a preferable structure for enhancing the driving power and attaining the excellent sub-threshold characteristic.

Further, a MOSFET having a channel/gate insulating film interface on the substrate of the (111) surface orientation has a problem that the interface state in the interface between the gate insulating film and the silicon substrate is high and a large number of fixed charges are present in the gate insulating film. That is, the reliability of the transistor is lower than that of a MOSFET having a channel/gate insulating film interface on the substrate of the (100) surface orientation. In practice, in the case of a MOSFET having a gate insulating film of 5 nm thickness, the interface state density of the MOSFET on the substrate of the (111) surface orientation was increased to 2.2 times that of the MOSFET on the substrate of the (100) surface orientation. Further, a variation in the threshold voltage and variations in the transconductance and current driving ability are approximately twice larger.

BRIEF SUMMARY OF THE INVENTION

A semiconductor device according to an embodiment of this invention including field effect transistors each of which has a gate electrode formed on a semiconductor substrate with a gate insulating film disposed therebetween, a semiconductor layer opposite to the gate electrode forming a channel forming region, and source and drain regions formed on both sides of the channel forming region, comprises a first field effect transistor which has an epitaxial growth layer in the channel forming region and in which a surface portion of the channel forming region formed in contact with the gate insulating film is formed on the substrate of a silicon surface orientation; and a second field effect transistor which has the channel forming region having no epitaxial growth layer and in which a surface portion of the channel forming region formed in contact with the gate insulating film is formed on the substrate of a silicon surface orientation other than the (100) silicon surface orientation.

Further, a semiconductor device according to an embodiment of this invention including field effect transistors each of which has a gate electrode formed on a semiconductor substrate with a gate insulating film disposed therebetween, a semiconductor layer opposite to the gate electrode forming a channel forming region, and source and drain regions formed on both sides of the channel forming region, comprises a first field effect transistor which has a first channel impurity profile and in which a surface portion of the channel forming region formed in contact with the gate insulating film is formed on the substrate of a (100) silicon surface orientation; and a second field effect transistor which has a second channel impurity profile and in which a surface portion of the channel forming region formed in contact with the gate insulating film is formed on the substrate of a silicon surface orientation other than the (100) silicon surface orientation; wherein the first channel impurity profile provides a lower concentration in the surface portion of the channel forming region which is formed in contact with the gate insulating film in comparison with the second channel impurity profile.

Further, a semiconductor device according to an embodiment of this invention including a field effect transistor which has a gate electrode formed on a semiconductor substrate with a gate insulating film disposed therebetween, a semiconductor layer opposite to the gate electrode forming a channel forming region, and source and drain regions formed on both sides of the channel forming region, comprise a field effect transistor in which a surface portion of the channel forming region formed in contact with the gate insulating film includes a first region having an epitaxial growth layer and formed on the substrate of a (100) silicon surface orientation and a second region having no epitaxial growth layer and formed on the substrate of a silicon surface orientation other than the (100) silicon surface orientation.

Further, a semiconductor device according to an embodiment of this invention including a field effect transistor which has a gate electrode formed on a semiconductor substrate with a gate insulating film disposed therebetween, a semiconductor layer opposite to the gate electrode forming a channel forming region, and source and drain regions formed on both sides of the channel forming region, comprises a first field effect transistor which has an epitaxial growth layer on the source/drain region and in which a surface portion of the source/drain region formed in contact with one of a silicide layer and a metal interconnection layer is formed on the substrate of a (100) silicon surface orientation; and a second field effect transistor which has the source/drain region having no epitaxial growth layer formed thereon and in which a surface portion of the source/drain region formed in contact with one of a silicide layer and a metal interconnection layer is formed on the substrate of a silicon surface orientation other than the (100) silicon surface orientation.

Further, a semiconductor device according to an embodiment of this invention including a field effect transistor which has a gate electrode formed on a semiconductor substrate with a gate insulating film disposed therebetween, a semiconductor layer opposite to the gate electrode forming a channel forming region, and source and drain regions formed on both sides of the channel forming region, comprises a field effect transistor in which a surface portion of the source/drain region formed in contact with one of a silicide layer and a metal interconnection layer includes a first region having an epitaxial growth layer and formed on the substrate of a (100) silicon surface orientation and a second region having no epitaxial growth layer and formed on the substrate of a silicon surface orientation other than the (100) silicon surface orientation.

Further, a semiconductor device according to an embodiment of this invention including field effect transistors each of which has a gate electrode formed on a semiconductor substrate with a gate insulating film disposed therebetween, a semiconductor layer opposite to the gate electrode forming a channel forming region, and source and drain regions formed on both sides of the channel forming region, comprises a first field effect transistor in which a surface portion of the channel forming region formed in contact with the gate insulating film is formed on the substrate of a (100) silicon surface orientation; and a second field effect transistor in which a surface portion of the channel forming region formed in contact with the gate insulating film is formed on the substrate of a silicon surface orientation other than the (100) silicon surface orientation; wherein the film thickness of the gate insulating film of the second field effect transistor expressed in terms of an equivalent oxide thickness is smaller than the film thickness of the gate insulating film of the first field effect transistor expressed in terms of an equivalent oxide thickness.

Further, a semiconductor device according to an embodiment of this invention including field effect transistors each of which has a gate electrode formed on a semiconductor substrate with a gate insulating film disposed therebetween, a semiconductor layer opposite to the gate electrode forming a channel forming region, and source and drain regions formed on both sides of the channel forming region, comprises a first field effect transistor in which a surface portion of the channel forming region formed in contact with the gate insulating film is formed on the substrate of a (100) silicon surface orientation; and a second field effect transistor in which a surface portion of the channel forming region formed in contact with the gate insulating film is formed on the substrate of a silicon surface orientation other than the (100) silicon surface orientation; wherein the gate insulating film of the first field effect transistor is constructed as a stacked film of a first insulating film formed in contact with the channel forming region and a second insulating film formed of a material or composition different from the first insulating film, the gate insulating film of the second field effect transistor is constructed as a stacked film of a third insulating film formed in contact with the channel forming region and a fourth insulating film formed of a material or composition different from the third insulating film, and the film thickness of the third insulating film expressed in terms of an equivalent oxide thickness is smaller than the film thickness of the first insulating film expressed in terms of an equivalent oxide thickness.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 16 is a characteristic diagram for illustrating a variation in the film thickness of an oxide film in the wafer surface according to this invention;

FIG. 17 is a characteristic diagram for illustrating variations in the transconductance and threshold voltage of a MOSFET in the wafer surface according to this invention;

DETAILED DESCRIPTION OF THE INVENTION

Figure 1A:
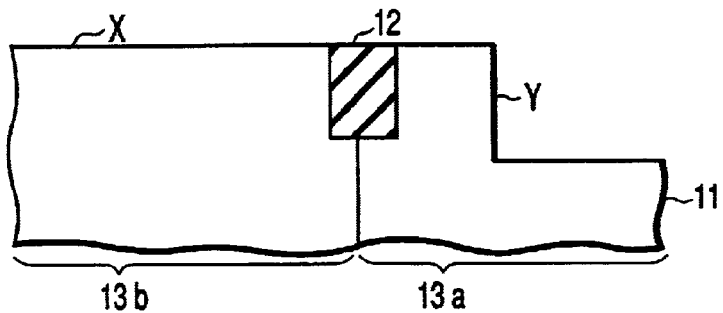
FIG. 1A to FIG. 1D are cross sectional views for illustrating the steps of a method for manufacturing a CMOS device according to a first embodiment of this invention.
Figure 1B:
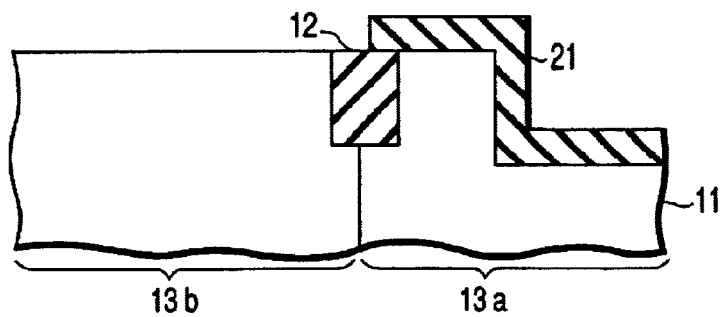
Figure 1C:
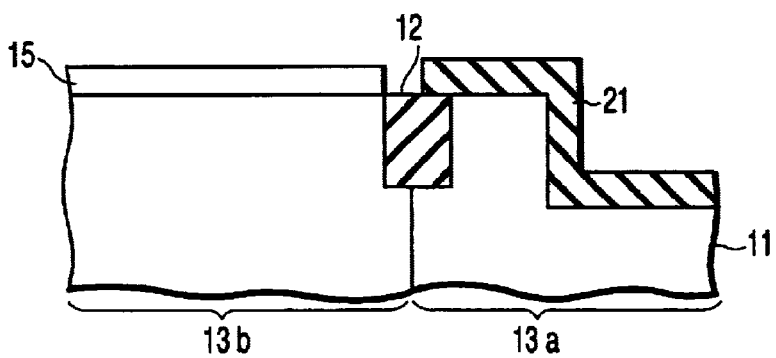
Figure 1D:
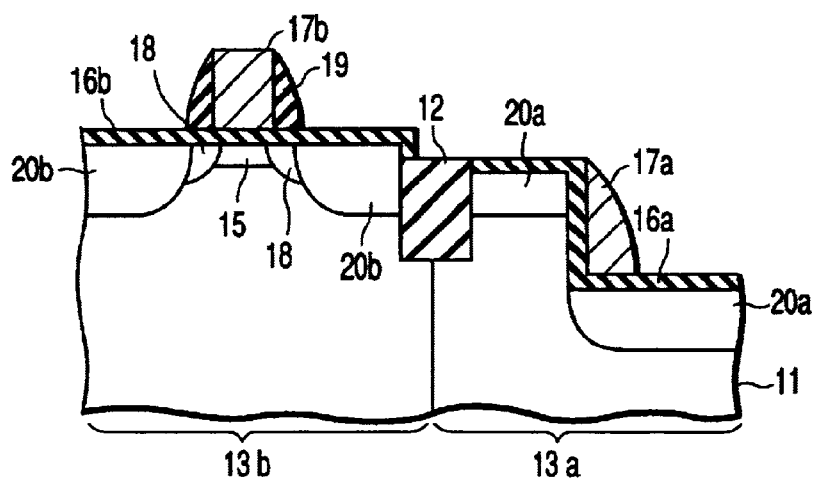

Before explaining the embodiments of this invention, the concept of this invention is first described.

In general, epitaxial growth on a silicon substrate of (100) surface orientation makes roughness on the silicon surface smaller than on the bulk surface. However, according to information newly acquired by the inventor of this application, epitaxial growth on a silicon substrate of surface orientation other than the (100) surface orientation increases roughness on the silicon surface.

Table 1 shows the results of the surface roughness of a silicon bulk (Bulk-Si) and silicon epitaxial growth layer (Epi-Si) evaluated by use of AFM (Atomic Force Microscope).

TABLE 1

| Surface orientation | | Ra (nm) | RMS (nm) |
|---|---|---|---|
| (100) | Bulk-Si | 0.11 | 0.14 |
| (111) | | 0.11 | 0.13 |

TABLE 1-continued

| Surface orientation | | Ra (nm) | RMS (nm) |
|---|---|---|---|
| (100) | Epi-Si | 0.08 | 0.10 |
| (111) | | 0.19 | 0.24 |

In this case, Ra (least square roughness) is a square root of the mean value of squares of deflections from the central surface to the surface on the quantitative surface and RMS (arithmetical means roughness) is a mean value of absolute values of deflections from the central surface to the surface on the quantitative surface.

A variation in the roughness of the silicon surface due to the epitaxial growth is extremely strongly influenced by the silicon growth rate in the respective surface orientations. It is predicted that the reason why the results shown in Table 1 are obtained is that the epitaxial growth rate in a direction of (100) surface orientation of silicon is higher than that in a direction of other surface orientations and the epitaxial growth rate in a direction of (111) surface orientation is lower than that in a direction of other surface orientations including the (100) surface orientation. Therefore, in the case of a MOSFET having a silicon epitaxial growth layer on the substrate of the (111) surface orientation other than the (100) surface orientation in the channel portion, the reliability and the characteristic such as a gate leakage current of the transistor are degraded in comparison with the MOSFET on the substrate of the (100) surface orientation since the interface roughness increases.

Further, when a MOSFET having a silicon epitaxial growth layer in the source/drain regions is formed on the substrate of a surface orientation other than the (100) surface orientation, the characteristic of the silicide/silicon interface is degraded and a junction current increases since the roughness of the silicon interface increases.

The above problem occurs not only in the transistor on the substrate of the (111) surface orientation, but the same problem occurs in a transistor on the substrate of a surface orientation such as (110), (113), (115) on which it is known that the growth rate of silicon is lower than on the (100) surface orientation (for example, refer to C. H. J. Van den Brekel, "Growth rate anisotropy and morphology of autoepitaxial silicon films from SiCl$_4$, "J of Crystal Growth, pp. 259–266, 1974, (refer to reference document [4])) or a surface orientation such as (211), (311), (511), (811), (101), (011).

There will now be described embodiments of this invention made for solving the above problem with reference to the accompanying drawings.

First Embodiment

FIG. 1A to FIG. 1D show a manufacturing method a CMOS device according to a first embodiment of this invention.

First, the surface portion of a silicon substrate 11 of (100) surface orientation X is processed by a known technique such as the silicon anisotropic etching technique to expose part of the surface portion having a surface orientation (in this example, (110) surface orientation Y) other than the (100) surface orientation X. Then, an element isolation region 12 is formed in the surface portion of the silicon substrate 11 to define element regions (N-type well region 13a, P-type well region 13b). In this case, the (110) surface orientation Y is formed on the surface portion of the N-type well region 13a which is a forming region of a second MOSFET (P-type MOSFET) having a second channel impurity profile (refer to FIG. 1A).

Next, a silicon sacrificing oxide film (not shown) with a film thickness of 12 nm is formed on the surface portions of the N-type well region 13a and P-type well region 13b and then arsenic and boron which are impurities for attaining desired threshold voltages are doped into the channel portions of the N-type well region 13a and P-type well region 13b.

After this, part of the silicon sacrificing oxide film is removed so as to cover only the N-type well region 13a with a cover insulating film 21. That is, the silicon sacrificing oxide film is left behind only on the N-type well region 13a except the P-type well region 13b which is the forming region of the first MOSFET (N-type MOSFET) (refer to FIG. 1B).

Then, a pre-heating process at 940° C. is effected as a pre-process for removing residual oxygen in the surface portion of the silicon substrate 11.

Next, a silicon epitaxial growth layer (non-doped epitaxial silicon layer) 15 having a first channel impurity profile is formed with a film thickness of approx. 30 nm only on the main surface of the P-type well region 13b which is used as the channel portion of the N-type MOSFET, for example, by use of Si$_2$H$_4$Cl$_2$ gas, at the temperature of 800° C. by the RP-CVD method. By effecting the above process, a channel portion of the N-type MOSFET formed on the silicon substrate 11 of the (100) surface orientation X and having an extremely steep impurity concentration gradient is realized.

After this, the cover insulating film (silicon sacrificing oxide film) 21 which covers the N-type well region 13a is removed.

Then, the gate oxidation process is effected by a rapid ramp heating (RTO) method. By effecting the gate oxidation process, oxide films used for respectively forming gate insulating films 16a, 16b with the preset film thickness are formed on the N-type well region 13a and P-type well region 13b. For example, if the gate oxidation process is effected in a condition of the temperature of 800° C. and the oxidizing time of 10 seconds by the RTO method, an oxide film with a film thickness of 1.5 nm can be formed. If the RTO method or furnace oxidation method is used, the gate insulating films 16a, 16b with desired film thickness can be formed by adequately selecting the temperature and time.

Next, after a polysilicon film is deposited on the gate insulating films 16a, 16b to a film thickness of approx. 250 nm, the polysilicon film is patterned by anisotropic etching. Thus, gate electrodes 17a, 17b having desired gate length are respectively formed on the N-type well region 13a and P-type well region 13b.

Then, after preset impurity is doped, the heat treatment is effected in a nitrogen atmosphere at the temperature of 1000° C. for 20 seconds, for example, in order to diffuse and activate the doped impurity. By effecting the heat treatment, shallow source/drain regions 18 are formed on the surface portion of the P-type well region 13b.

After this, gate side wall portions 19 of the gate electrode 17b and source/drain regions 20a, 20b which are deeper than the shallow source/drain regions 18 are formed. As a result, an NMOS transistor (N-type MOSFET) formed on the silicon substrate 11 of the (100) surface orientation X and having the silicon epitaxial growth layer 15 in the channel portion and a PMOS transistor (P-type MOSFET) formed on the silicon substrate 11 of the (110) surface orientation Y different from the (100) surface orientation X, having no silicon epitaxial growth layer 15 in the channel portion and having the channel portion formed of the N-type well region 13a are completed (refer to FIG. 1D).

Then, silicide layers (not shown) are formed on the surface portions of the source/drain regions 20a, 20b and the gate electrodes 17a, 17b. After thus lowering the resistance of each of the electrode portions, the electrode portions are connected to metal interconnections via contact portions.

Thus, in a case where the characteristic of the MOSFET on the silicon substrate 11 of the (100) surface orientation X is further enhanced, MOSFETs with extremely high reliability, small leakage current and excellent noise characteristic can be formed on the same silicon substrate 11 without damaging the advantages of the MOSFETs formed on various surface orientations other than the (100) surface orientation X by using the epitaxial channel structure.

In this embodiment, a case wherein the channel portion of the N-type MOSFET is formed on the silicon substrate 11 of the (100) surface orientation X and the P-type MOSFET is formed on the surface orientation other than the (100) surface orientation x is explained. In this case, excellent mobility can be attained in both of the N-type MOSFET and P-type MOSFET and a CMOS device with high reliability, small leakage current and excellent noise characteristic can be formed.

Further, in a case where MOSFETs of the same conductivity type are formed on the silicon substrate of (100) surface orientation and the surface orientation different from the (100) surface orientation (for example, N-type MOSFETs are formed on both of the surface orientations or P-type MOSFETs are formed on both of the surface orientations), MOSFETs with high reliability, small leakage current and excellent noise characteristic can be formed in the same manner. In this case, a MOSFET having the same conductivity type as and different threshold voltage from a MOSFET formed on the silicon substrate of the surface orientation different from the (100) surface orientation and having no silicon epitaxial growth layer can be formed together with the latter MOSFET on the same silicon substrate by forming a silicon epitaxial growth layer of low concentration only in the channel portion of the MOSFET on the silicon substrate of the (100) surface orientation.

Second Embodiment

FIG. 2A to FIG. 2D show a manufacturing method of a CMOS device according to a second embodiment of this invention. In this example, a case wherein only a surface orientation other than at least a (100) surface orientation, for example, only a (110) surface orientation on a silicon substrate is covered with an insulating film and a silicon epitaxial growth layer is formed on the entire region except the (110) surface orientation is explained.

First, the surface portion of a silicon substrate 11 of (100) surface orientation X is processed by a known technique such as the silicon anisotropic etching technique to expose part of the surface portion having a (110) surface orientation Y other than the (100) surface orientation X. Then, an element isolation region 12 is formed in the surface portion of the silicon substrate 11 to define element regions (N-type well region 13a, P-type well region 13b). In this case, the (110) surface orientation Y is formed on the surface portion of the N-type well region 13a which is a forming region of a second MOSFET (P-type MOSFET) having a second channel impurity profile (refer to FIG. 2A).

Next, a silicon sacrificing oxide film (not shown) with a film thickness of 12 nm is formed on the surface portions of the N-type well region 13a and P-type well region 13b and then arsenic and boron which are impurities for attaining desired threshold voltages are doped into the channel portions of the N-type well region 13a and P-type well region 13b.

After this, part of the silicon sacrificing oxide film is removed so as to cover the channel forming region of the N-type well region 13a which lies on the (110) surface orientation Y with a cover insulating film 21. That is, the silicon sacrificing oxide film is left behind only on a portion of the (110) surface orientation Y except the P-type well region 13b which is the forming region of the first MOSFET (N-type MOSFET) and a portion of the (100) surface orientation X on the N-type well region 13a (refer to FIG. 2B).

Then, a pre-heating process at 940° C. is effected as a pre-process for removing residual oxygen in the surface portion of the silicon substrate 11.

Figure 2A:
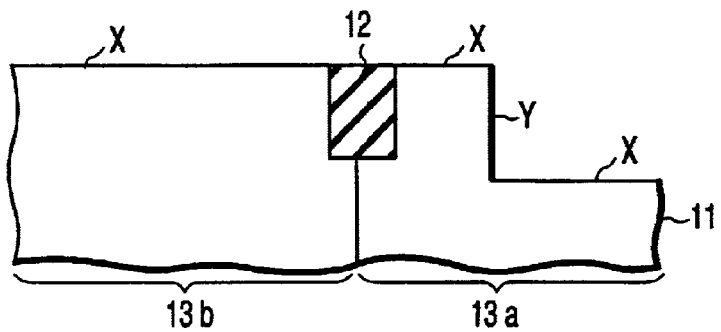
FIG. 2A to FIG. 2D are cross sectional views for illustrating the steps of a method for manufacturing a CMOS device according to a second embodiment of this invention.
Figure 2B:
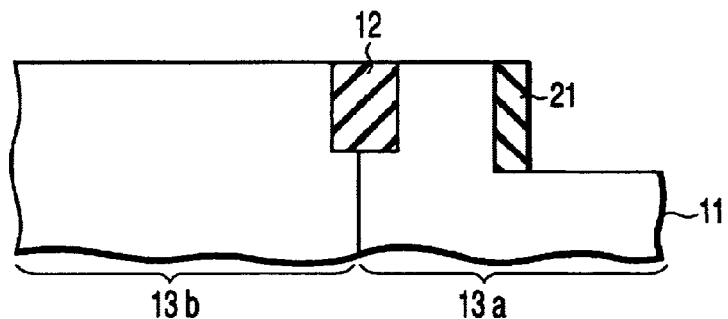
Figure 2C:
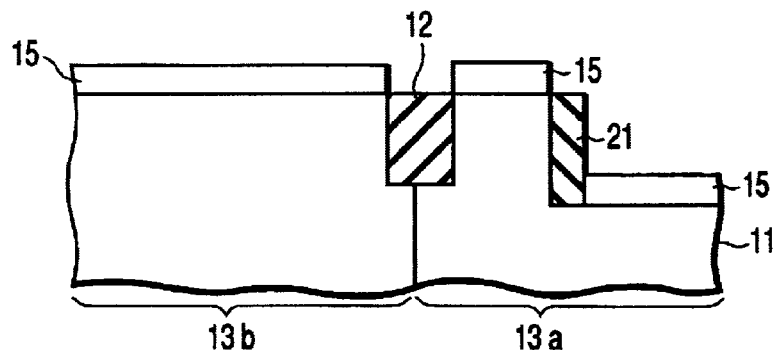
Figure 2D:
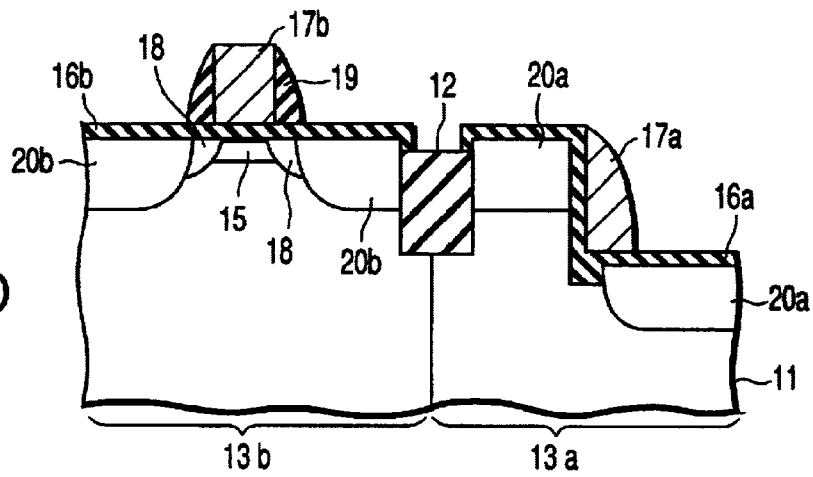
Figure 3A:
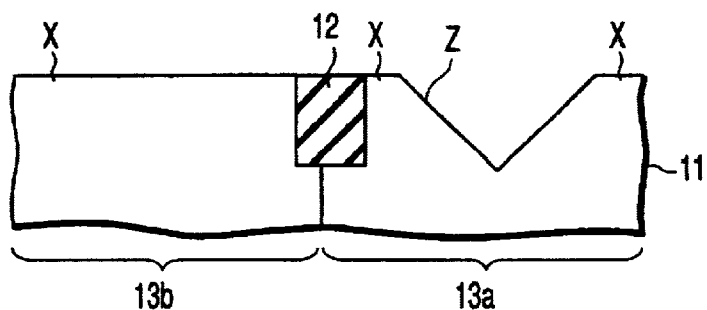
FIG. 3A to FIG. 3D are cross sectional views for illustrating the steps of a method for manufacturing a different structure of the CMOS device according to the second embodiment of this invention.
Figure 3B:
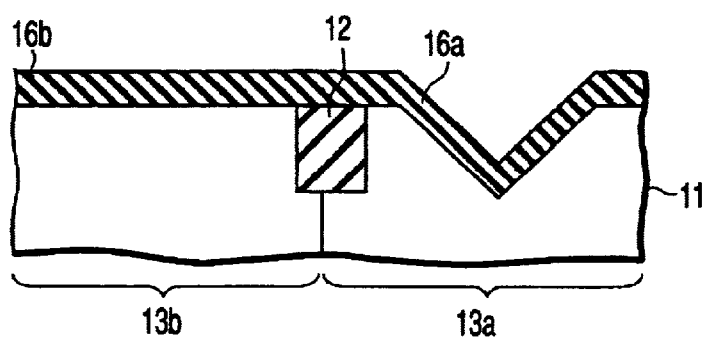
Figure 3C:
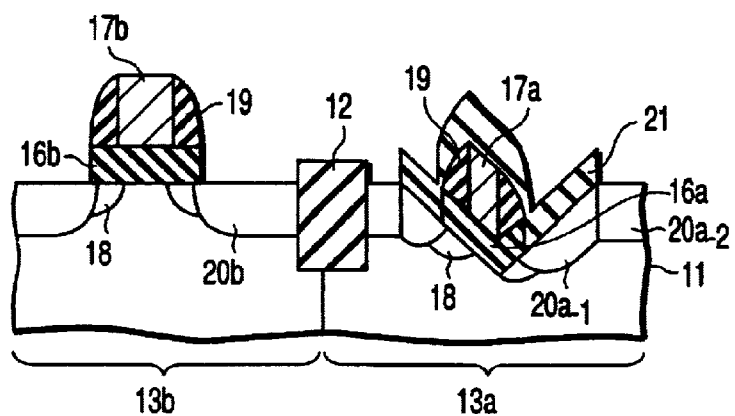
Figure 3D:
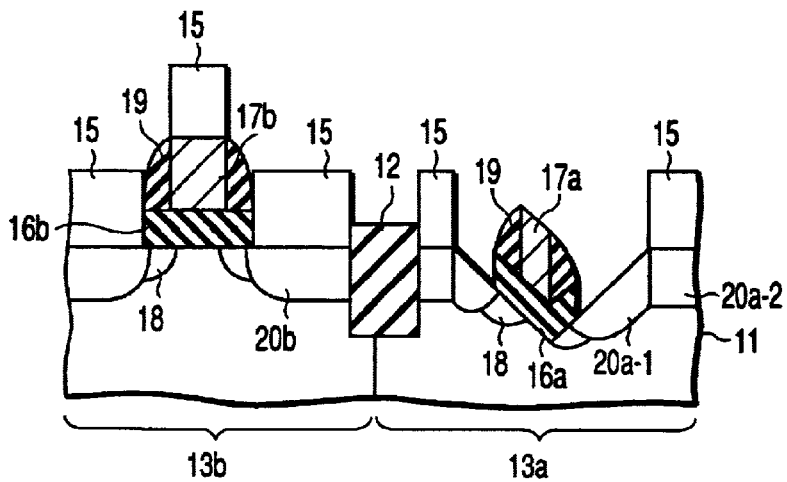

Next, a silicon epitaxial growth layer (non-doped epitaxial silicon layer) 15 having a first channel impurity profile is formed with a film thickness of approx. 30 nm on the portion of (100) surface orientation X containing at least the main surface of the P-type well region 13b which is used as the channel portion of the N-type MOSFET, for example, by use of $Si_2H_4Cl_2$ gas at the temperature of 800° C. by the RP-CVD method (refer to FIG. 2C). By effecting the above process, a channel portion of the N-type MOSFET formed on the silicon substrate of the (100) surface orientation X and having an extremely steep impurity concentration gradient is realized.

After this, the cover insulating film (silicon sacrificing oxide film) 21 which covers the portion of (110) surface orientation Y is removed.

Then, the gate oxidation process is effected by the RTO method. By effecting the gate oxidation process, oxide films used for respectively forming gate insulating films 16a, 16b with the preset film thickness are formed on the N-type well region 13a and P-type well region 13b. For example, if the gate oxidation process is effected in a condition of the temperature of 800° C. and the oxidizing time of 10 seconds by the RTO method, an oxide film with a film thickness of 1.5 nm can be formed. If the RTO method or furnace oxidation method is used, the gate insulating films 16a, 16b with desired film thickness can be formed by adequately selecting the temperature and time.

Next, after a polysilicon film is deposited on the gate insulating films 16a, 16b to a film thickness of approx. 250 nm, the polysilicon film is patterned by anisotropic etching. Thus, gate electrodes 17a, 17b having desired gate length are respectively formed on the N-type well region 13a and P-type well region 13b.

Then, after preset impurity is doped, in order to diffuse and activate the doped impurity, the heat treatment is effected in a nitrogen atmosphere at the temperature of 1000° C. for approx. 20 seconds, for example. By effecting the heat treatment, shallow source/drain regions 18 are formed on the surface portion of the P-type well region 13b.

After this, gate side wall portions 19 of the gate electrode 17b and source/drain regions 20a, 20b which are deeper than the shallow source/drain regions 18 are formed. As a result, an NMOS transistor (N-type MOSFET) formed on the silicon substrate 11 of the (100) surface orientation X and having the silicon epitaxial growth layer 15 in the channel portion and a PMOS transistor (P-type MOSFET) formed on the silicon substrate of the (110) surface orientation Y different from the (100) surface orientation X, having no silicon epitaxial growth layer 15 in the channel portion and having the channel portion formed of the N-type well region 13a are completed (refer to FIG. 2D).

Then, silicide layers (not shown) are formed on the surface portions of the source/drain regions 20a, 20b and the gate electrodes 17a, 17b. After thus lowering the resistance of each of the electrode portions, the electrode portions are connected to metal interconnections via contact portions.

Thus, in the case of the present embodiment in which the silicon epitaxial growth layer 15 is formed on the portion of (100) surface orientation X except the (110) surface orientation Y, the same effect as that obtained in the CMOS device of the first embodiment can be expected. In this case, since the silicon epitaxial growth layer 15 is formed only on the silicon substrate of the (100) surface orientation X and an increase in the roughness on the silicide/silicon interface is suppressed in the source/drain regions 20a of the MOSFET having the channel portion on the (110) surface orientation Y, an increase in the source/drain junction leak current can be prevented.

Further, in a case where the silicide film is not formed on the source/drain regions 20a, 20b, an increase in the roughness on the interconnection contact (metal interconnection layer)/silicon interface is suppressed in the source/drain regions 20a of the MOSFET having the channel portion on the (110) surface orientation Y, and therefore, an increase in the source/drain junction leak current can be prevented.

Further, as shown in FIGS. 3A to FIG. 3D, the same effect can be attained by covering a source/drain region $20a_{-1}$ on, for example, a (111) surface orientation Z other than the (100) surface orientation X with the cover insulating film 21 after the gate electrodes 17a, 17b are formed and selectively forming silicon epitaxial growth layers 15 on the source/drain regions 20b of a first MOSFET on the silicon substrate of the (100) surface orientation X and a source/drain region $20a_{-2}$ among the source/drain regions $20a_{-1}$, $20a_{-2}$ of a second MOSFET having a channel portion on the (111) surface orientation Z which has an exposed surface portion of (100) surface orientation X (so-called elevate source/drain structure).

Figure 4:
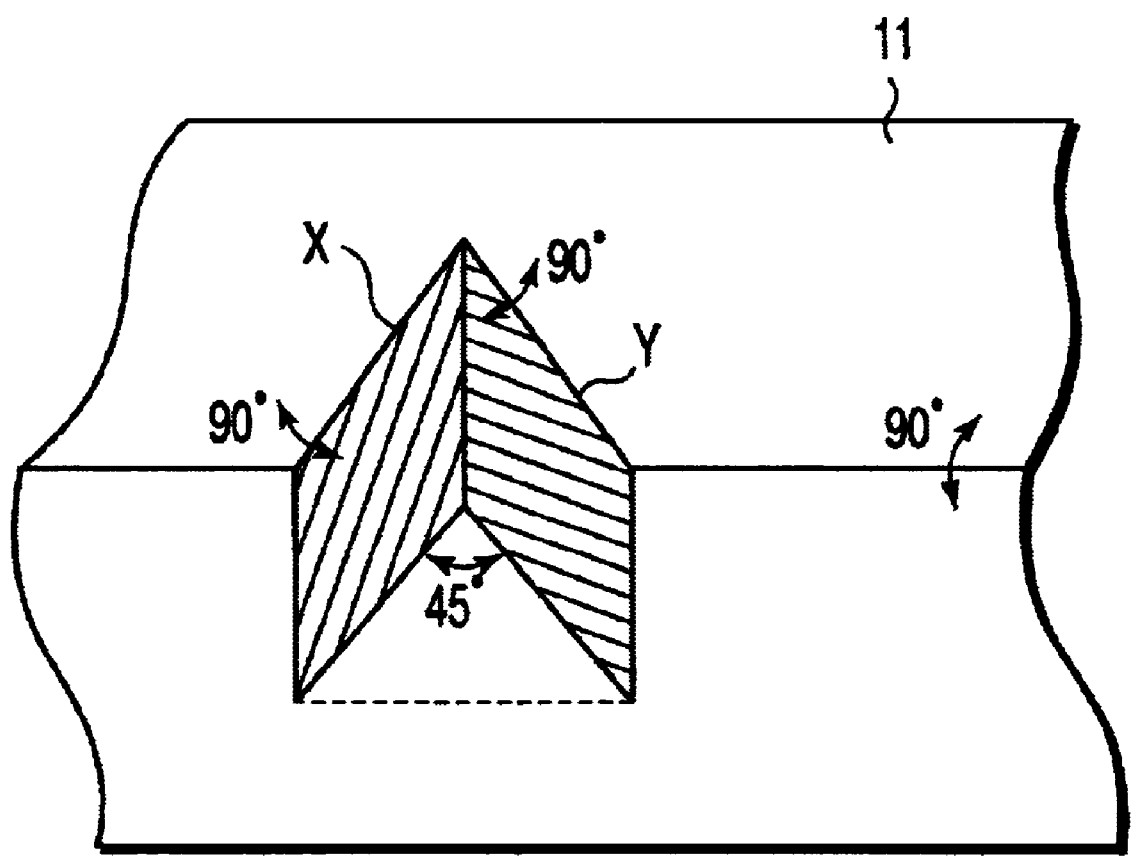
FIG. 4 is a perspective view for illustrating a method for manufacturing a still different structure of the CMOS device according to the second embodiment of this invention.

FIG. 4 and FIG. 5A to FIG. 5D show examples in which at least a (100) surface orientation X and a surface orientation other than the (100) surface orientation X, for example, a (110) surface orientation Y are exposed to the surface portion of the silicon substrate 11 and a silicon epitaxial growth layer 15 is formed on the entire region except the region of (110) surface orientation Y. FIG. 4 is a perspective view of the silicon substrate 11 and FIG. 5A to FIG. 5D are cross sectional views showing the portions of (100) surface orientation X and (110) surface orientation Y.

First, the surface portion of the silicon substrate 11 of (100) surface orientation is processed by a known technique such as the silicon anisotropic etching technique to expose part of the surface portion having the (100) surface orientation X and (110) surface orientation Y other than the (100) surface orientation X. In this case, as shown in FIG. 4, for example, the (100) surface orientation X and (110) surface orientation Y both make an angle of 90° with respect to the silicon substrate 11 and an angle of 45° (or 135°) is made between the (100) surface orientation X and (110) surface orientation Y.

Figure 5A:
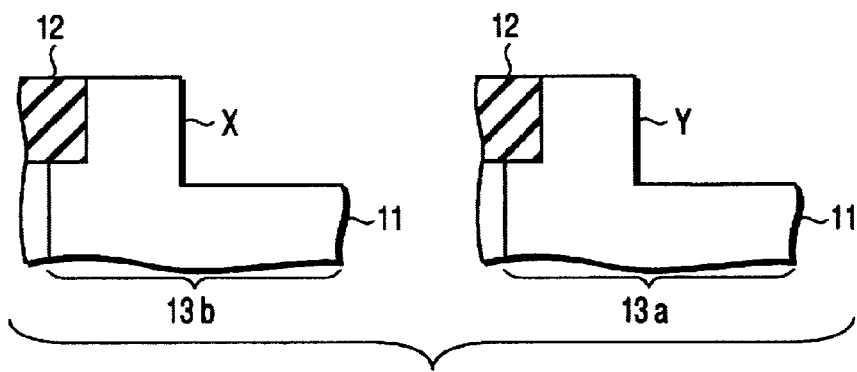
FIG. 5A to FIG. 5D are cross sectional views for illustrating the steps of a method for manufacturing the CMOS device shown in FIG. 4.

Then, as shown in FIG. 5A, an element isolation region 12 is formed in the surface portion of the silicon substrate 11 to define element regions (N-type well region 13a, P-type well region 13b). In this case, the (100) surface orientation X is formed on the surface portion of the P-type well region 13b which is a forming region of a first MOSFET (N-type MOSFET) having a first channel impurity profile. Further, the (110) surface orientation Y is formed on the surface portion of the N-type well region 13a which is a forming region of a second MOSFET (P-type MOSFET) having a second channel impurity profile Next, a silicon sacrificing oxide film (not shown) with a film thickness of 12 nm is formed on the surface portions of the N-type well region 13a and P-type well region 13b and then arsenic and boron which are impurities for attaining desired threshold voltages are doped into the channel portions of the N-type well region 13a and P-type well region 13b.

Figure 5B:
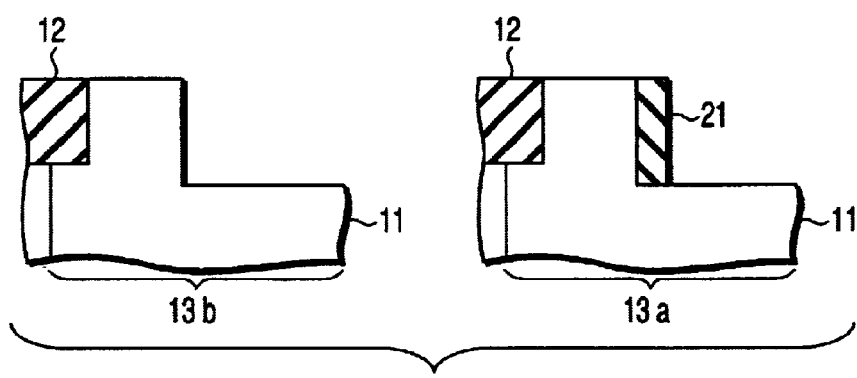

After this, as shown in FIG. 5B, for example, part of the silicon sacrificing oxide film is removed so as to cover the channel forming region of the N-type well region 13a which lies on the (110) surface orientation with a cover insulating film 21. That is, the silicon sacrificing oxide film is left behind only on the (110) surface orientation Y.

Then, a pre-heating process at 940° C. is effected as a pre-process for removing residual oxygen in the surface portion of the silicon substrate 11.

Figure 5C:
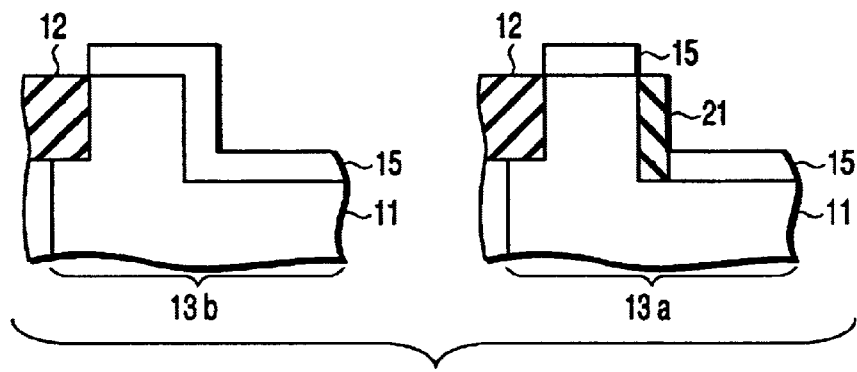

Next, as shown in FIG. 5C, a silicon epitaxial growth layer (non-doped epitaxial silicon layer) 15 having the first channel impurity profile is formed with a film thickness of approx. 30 nm on the silicon substrate of the (100) surface orientation X containing at least the main surface of the P-type well region 13b which is used as the channel portion of the N-type MOSFET, for example, by use of $Si_2H_4Cl_2$ gas at the temperature of 800° C. by the RP-CVD method. By effecting the above process, a channel portion of the N-type MOSFET formed on the silicon substrate on the (100) surface orientation X and having an extremely steep impurity concentration gradient is attained.

After this, the cover insulating film (silicon sacrificing oxide film) 21 which covers the on the silicon substrate of the (110) surface orientation Y is removed.

Figure 5D:
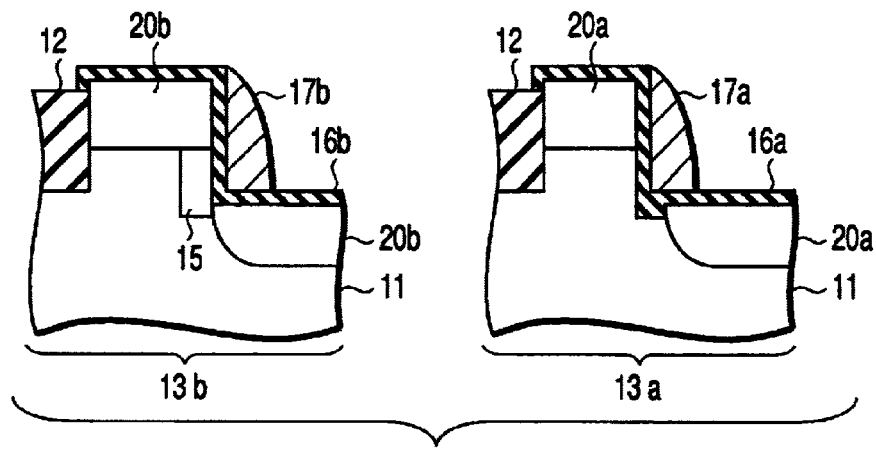

Then, as shown in FIG. 5D, the gate oxidation process is effected by the RTO method. By effecting the gate oxidation process, oxide films used for respectively forming gate insulating films 16a, 16b with the preset film thickness are formed on the N-type well region 13a and P-type well region 13b. For example, if the gate oxidation process is effected in a condition of the temperature of 800° C. and the oxidizing time of 10 seconds by the RTO method, an oxide film with a film thickness of 1.5 nm can be formed. If the RTO method or furnace oxidation method is used, the gate insulating films 16a, 16b with desired film thickness can be formed by adequately selecting the temperature and time.

Next, after a polysilicon film is deposited on the gate insulating films 16a, 16b to a film thickness of approx. 250 nm, the polysilicon film is patterned by anisotropic etching. Thus, gate electrodes 17a, 17b having desired gate length are respectively formed on the N-type well region 13a and P-type well region 13b.

The present embodiment relates to the gate electrode 17a of the MOSFET on the silicon substrate 11 of the (110) surface orientation Y and the gate electrode 17b of the MOSFET on the silicon substrate 11 of the (100) surface orientation X and both of them constitute vertical MOSFET structures in which the gate length directions make 90° with respect to the substrate surface of the silicon substrate 11 of (100) surface orientation. Therefore, the gate electrodes 17a, 17b can be formed in the same process, the manufacturing process can be more simplified, consistency of the process is excellent and the process becomes suitable for miniaturization.

Then, after preset impurity is doped, in order to diffuse and activate the doped impurity, the heat treatment is effected in a nitrogen atmosphere at the temperature of 1000° C. for approx. 20 seconds, for example. By effecting the heat treatment, source/drain regions 20a, 20b are respectively formed on the surface portions of the N-type well region 13a and P-type well region 13b. As a result, an N-type MOSFET formed on the silicon substrate of the (100) surface orientation X and having the silicon epitaxial growth layer 15 in the channel portion and a P-type MOSFET formed on the silicon substrate of the (110) surface orientation Y different from the (100) surface orientation, having no silicon epitaxial growth layer 15 in the channel portion and having the channel portion formed of the N-type well region 13a are completed.

Then, silicide layers (not shown) are formed on the surface portions of the source/drain regions 20a, 20b and the gate electrodes 17a, 17b. After thus lowering the resistance of each of the electrode portions, the electrode portions are connected to metal interconnections via contact portions.

A case wherein the silicon substrate 11 of (100) surface orientation is used is explained, but this is not limitative and a silicon substrate of (110) surface orientation can also be used. That is, the same effect can be attained by exposing the (100) surface orientation and (110) surface orientation to the surface portion of the silicon substrate of (110) surface orientation by silicon anisotropic etching, for example, and forming MOSFETs on the silicon substrate of the respective surface orientations.

In this embodiment, a case wherein the channel portion of the N-type MOSFET is formed on the silicon substrate of the (100) surface orientation X and the channel portion of the P-type MOSFET is formed on the silicon substrate of the surface orientation different from the (100) surface orientation is explained. In this case, excellent mobility can be attained in both of the N-type MOSFET and P-type MOSFET and a CMOS device with high reliability, small leakage current and excellent noise characteristic can be formed.

Further, in a case where MOSFETs of the same conductivity type are formed on the silicon substrate of the (100) surface orientation and the surface orientation different from the (100) surface orientation (for example, N-type MOSFETs are formed on the silicon substrate on both of the surface orientations or P-type MOSFETs are formed on the silicon substrate on both of the surface orientations), MOSFETs with high reliability, small leakage current and excellent noise characteristic can be formed in the same manner. In this case, a MOSFET having the same conductivity type as and different threshold voltage from a MOSFET formed on the silicon substrate of the surface orientation different from the (100) surface orientation and having no silicon epitaxial growth layer can be formed together with the latter MOSFET on the same silicon substrate by forming a silicon epitaxial growth layer of low concentration only in the channel portion of the MOSFET on the silicon substrate of the (100) surface orientation.

Third Embodiment

FIG. 6A to FIG. 6D show a manufacturing method of a CMOS device according to a third embodiment of this invention. In this example, a case wherein a P-type MOSFET is formed on a substrate of a surface orientation other than at least a (100) surface orientation, for example, on a (111) surface orientation on a silicon substrate is formed is explained.

First, the surface portion of a silicon substrate 11 of (100) surface orientation X is processed by a known technique such as the chemical liquid phase etching technique to form a V-shaped groove in part of the surface portion thereof and expose a (111) surface orientation Z other than the (100) surface orientation X. Then, an element isolation region 12 is formed in the surface portion of the silicon substrate 11 to define element regions (N-type well region 13a, P-type well region 13b). In this case, the (111) surface orientation Z is formed on the surface portion of the N-type well region 13a which is a forming region of a second MOSFET (P-type MOSFET) having a second channel impurity profile (refer to FIG. 6A).

Next, a silicon sacrificing oxide film (not shown) with a film thickness of 12 nm is formed on the surface portions of the N-type well region 13a and P-type well region 13b and then arsenic and boron which are impurities for attaining desired threshold voltages are doped into the channel portions of the N-type well region 13a and P-type well region 13b.

After this, part of the silicon sacrificing oxide film is removed so as to cover only the N-type well region 13a (or a portion of the N-type well region 13a which lies on at least the (111) surface orientation Z) with a cover insulating film 21. That is, the silicon sacrificing oxide film is left behind only on the N-type well region 13a (or a portion of the N-type well region 13a which lies on the (111) surface orientation Z except the (100) surface orientation X) except the P-type well region 13b which is the forming region of the first MOSFET (N-type MOSFET) (refer to FIG. 6B).

Then, a pre-heating process at 940° C. is effected as a pre-process for removing residual oxygen in the surface portion of the silicon substrate 11.

Figure 6A:
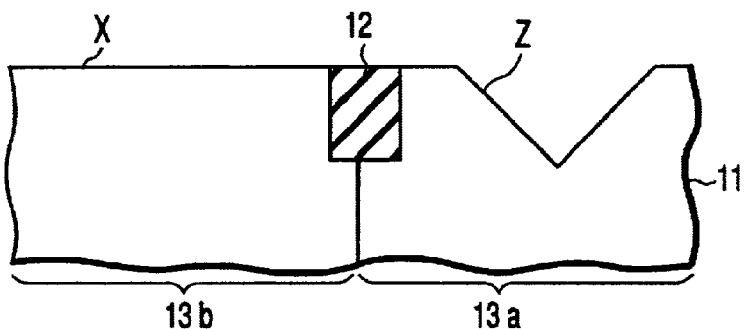
FIG. 6A to FIG. 6D are cross sectional views for illustrating the steps of a method for manufacturing a CMOS device according to a third embodiment of this invention.
Figure 6B:
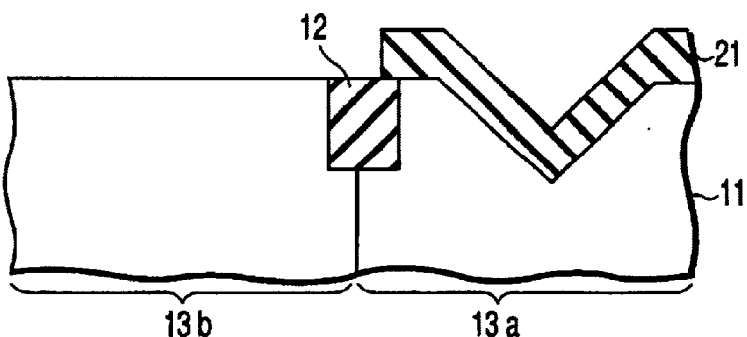
Figure 6C:
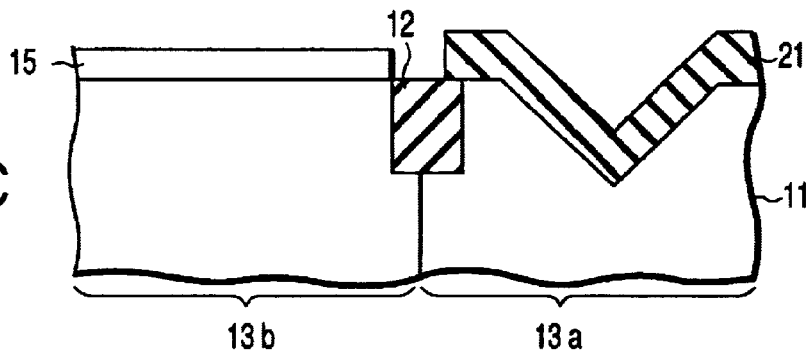
Figure 6D:
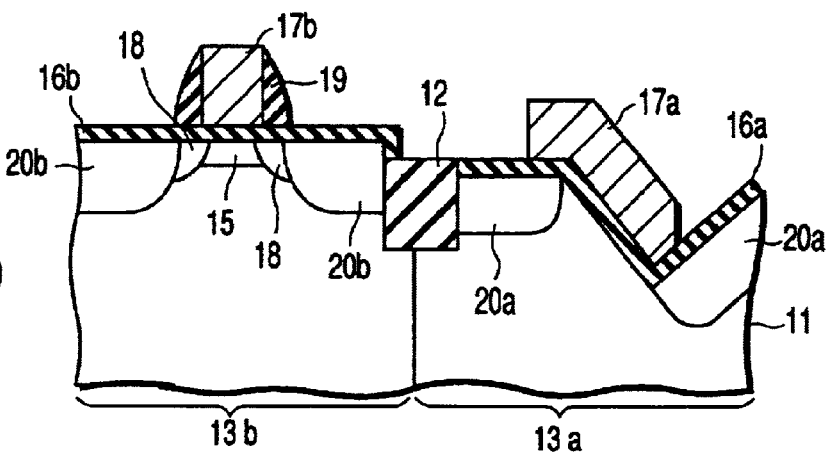

Next, a silicon epitaxial growth layer (non-doped epitaxial silicon layer) 15 having a first channel impurity profile is formed with a film thickness of approx. 30 nm on the (100) surface orientation X of the P-type well region 13b which is used at least as the channel portion of the N-type MOSFET, for example, by use of $Si_2H_4Cl_2$ gas at the temperature of 800° C. by the RP-CVD method (refer to FIG. 6C). By effecting the above process, a channel portion of the N-type MOSFET formed on the silicon substrate of the (100) surface orientation x and having an extremely steep impurity concentration gradient is realized.

After this, the cover insulating film (silicon sacrificing oxide film) 21 which covers at least the (111) surface orientation Z is removed.

Then, the gate oxidation process is effected by the RTO method. By effecting the gate oxidation process, oxide films used for respectively forming gate insulating films 16a, 16b with the preset film thickness are formed on the N-type well region 13a and P-type well region 13b. For example, if the gate oxidation process is effected in a condition of the temperature of 800° C. and the oxidizing time of 10 seconds by the RTO method, an oxide film with a film thickness of 1.5 nm can be formed. If the RTO method or furnace oxidation method is used, the gate insulating films 16a, 16b with desired film thickness can be formed by adequately selecting the temperature and time.

Next, after a polysilicon film is deposited on the gate insulating films 16a, 16b to a film thickness of approx. 250 nm, the polysilicon film is patterned by anisotropic etching. Thus, gate electrodes 17a, 17b having desired gate length are respectively formed on the N-type well region 13a and P-type well region 13b.

Then, after preset impurity is doped, in order to diffuse and activate the doped impurity, the heat treatment is effected in a nitrogen atmosphere at the temperature of 1000° C. for approx. 20 seconds, for example. By effecting the heat treatment, shallow source/drain regions 18 are formed on the surface portion of the P-type well region 13b.

After this, gate side wall portions 19 of the gate electrode 17b and source/drain regions 20a, 20b which are deeper than the shallow source/drain regions 18 are formed. As a result, an NMOS transistor (N-type MOSFET) formed on the silicon substrate of the (100) surface orientation X and having the silicon epitaxial growth layer 15 in the channel portion and a PMOS transistor (P-type MOSFET) formed on the silicon substrate of the (111) surface orientation Z different from the (100) surface orientation, having no silicon epitaxial growth layer 15 in the channel portion and having the channel portion formed of the N-type well region 13a are completed (refer to FIG. 6D).

Then, silicide layers (not shown) are formed on the surface portions of the source/drain regions 20a, 20b and the gate electrodes 17a, 17b. After lowering the resistance of each of the electrodes, the electrodes are connected to metal interconnections via contact portions.

Thus, also, in the case of the present embodiment in which the MOSFETs are formed on the silicon substrate of the (100) surface orientation X and the (111) surface orientation Z other than the (100) surface orientation X, the same effect as that obtained in the CMOS device of the first, second embodiments can be expected.

In this embodiment, a case wherein the channel portion of the N-type MOSFET is formed on the silicon substrate (100) surface orientation X and the channel portion of the P-type MOSFET is formed on the silicon substrate of the surface orientation different from the (100) surface orientation is explained. In this case, excellent mobility can be attained in both of the N-type MOSFET and P-type MOSFET and a CMOS device with high reliability, small leakage current and excellent noise characteristic can be formed.

Further, in a case where MOSFETs of the same conductivity type are formed on the substrate of the (100) surface orientation and the surface orientation different from the (100) surface orientation (for example, N-type MOSFETs are formed on the silicon substrate on the silicon substrate on both of the surface orientations or P-type MOSFETs are formed on the silicon substrate on the silicon substrate on both of the surface orientations), MOSFETs with high reliability, small leakage current and excellent noise characteristic can be formed in the same manner. In this case, a MOSFET having the same conductivity type as and different threshold voltage from a MOSFET formed on the silicon substrate of the surface orientation different from the (100) surface orientation and having no silicon epitaxial growth layer can be formed together with the latter MOSFET on the same silicon substrate by forming a silicon epitaxial growth layer of low concentration only in the channel portion of the MOSFET on the silicon substrate of the (100) surface orientation.

Fourth Embodiment

Figure 7A:
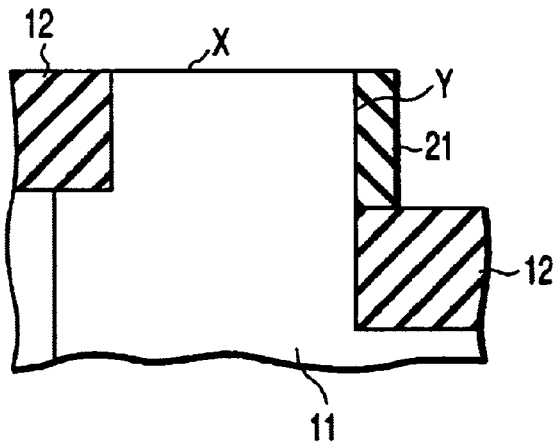
FIG. 7A to FIG. 7C are cross sectional views showing a first example of the structure, for illustrating the steps of a method for manufacturing a CMOS device according to a fourth embodiment of this invention.
Figure 7B:
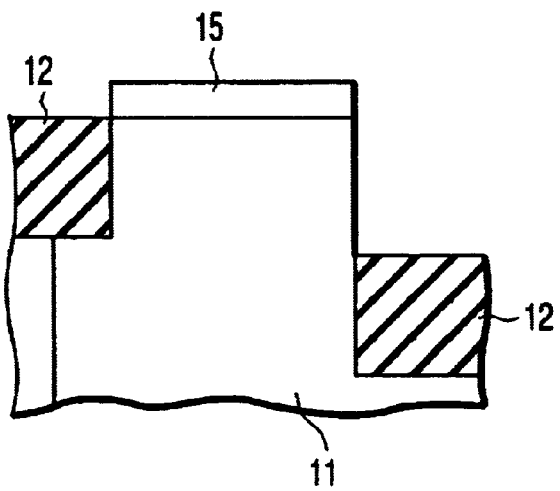
Figure 7C:
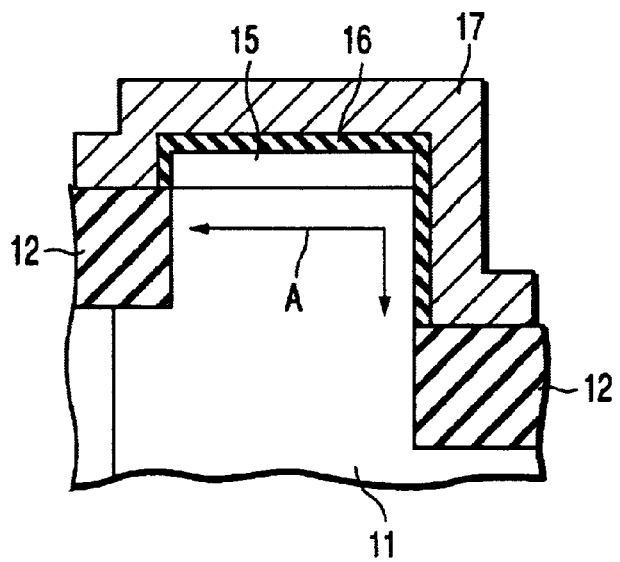

FIG. 7A to FIG. 7C show a manufacturing method of a CMOS device according to a fourth embodiment of this invention. In this example, a case wherein the channel portion of a MOSFET is so formed as to have at least a (100) surface orientation and a surface orientation other than the (100) surface orientation, for example, a (110) surface orientation on a silicon substrate in the cross section in the channel width direction is explained.

First, as shown in FIG. 7A, the surface portion of a silicon substrate 11 of (100) surface orientation X is processed by a known technique such as the silicon anisotropic etching technique to expose part of the surface portion having a surface orientation such as a (110) surface orientation Y other than the (100) surface orientation. Then, an element isolation region 12 is formed in the surface portion of the silicon substrate 11 to define regions in which the channel portion of a transistor is formed. In this case, the (110) surface orientation Y is exposed in addition to the (100) surface orientation in the cross section in the channel width direction in order to enhance the current driving ability for each unit area.

Next, a silicon sacrificing oxide film (not shown) with a film thickness of 12 nm is formed on the surface portion of the silicon substrate 11 and then boron or arsenic which is impurity for attaining desired threshold voltage is doped into the channel portion in the case of an N-type MOSFET or a P-type MOSFET, respectively.

After this, part of the silicon sacrificing oxide film is removed so as to cover only the portion of (110) surface orientation Y of the silicon substrate 11 with a cover insulating film 21. That is, the silicon sacrificing oxide film is left behind only on the portion of (110) surface orientation Y other than the (100) surface orientation X.

Then, a pre-heating process at 940° C. is effected as a pre-process for removing residual oxygen in the surface portion of the silicon substrate 11.

Next, as shown in FIG. 7B, a silicon epitaxial growth layer (non-doped epitaxial silicon layer) 15 is formed with a film thickness of approx. 30 nm on the silicon substrate of the (100) surface orientation X, for example, by use of $Si_2H_4Cl_2$ gas, at the temperature of 800° C. by the RP-CVD method.

After this, the cover insulating film (silicon sacrificing oxide film) 21 which covers on the silicon substrate of the (110) surface orientation Y is removed.

Then, as shown in FIG. 7C, the gate oxidation process is effected by the RTO method. By effecting the gate oxidation process, an oxide film used for forming a gate insulating film 16 with the preset film thickness is formed. For example, if the gate oxidation process is effected in a condition of the temperature of 800° C. and the oxidizing time of 10 seconds by the RTO method, an oxide film with a film thickness of 1.5 nm can be formed. If the RTO method or furnace oxidation method is used, the gate insulating film 16 with desired film thickness can be formed by adequately selecting the temperature and time.

Next, after a polysilicon film is deposited on the gate insulating film 16 to a film thickness of approx. 250 nm, the polysilicon film is patterned by anisotropic etching. Thus, a gate electrode 17 having desired gate width is formed.

Then, after preset impurity is doped to form source/drain regions, the heat treatment is effected in a nitrogen atmosphere at the temperature of 1000° C. for 20 seconds, for example, so as to diffuse and activate the doped impurity.

Thus, a MOSFET having the silicon surface portion on the (100) surface orientation X which has the silicon epitaxial growth layer 15 and the silicon surface portion on the (110) surface orientation Y which has no silicon epitaxial growth layer 15 as the channel portion is completed.

Then, silicide layers (not shown) are formed on the surface portions of the source/drain regions and the gate electrode 17. After thus lowering the resistance of each of the electrode portions, the electrode portions are connected to metal interconnections via contact portions.

Thus, in the case of this embodiment in which the silicon surface portions not only on the (100) surface orientation X but also on the (110) surface orientation Y are formed to be contained in the channel portion of the transistor, a portion indicated by a range A becomes almost equal to the channel width in the cross section in the channel width direction. As a result, the channel width can be made larger than the gate width as viewed from above the wafer. Therefore, the driving power can be further enhanced and the structure is made suitable for miniaturization.

Figure 8A:
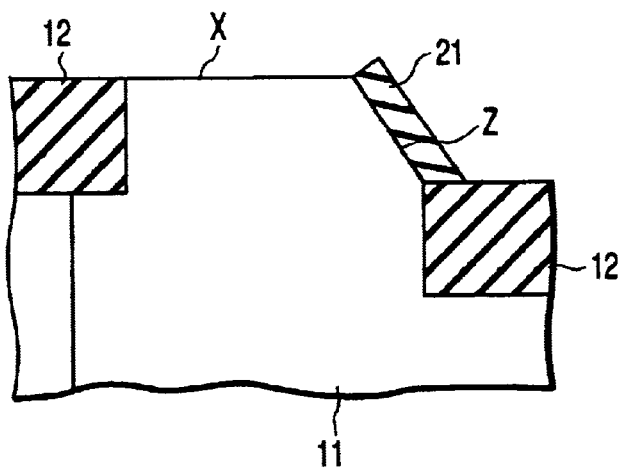
FIG. 8A to FIG. 8C are cross sectional views showing a second example of the structure, for illustrating the steps of a method for manufacturing the CMOS device according to the fourth embodiment of this invention.
Figure 8B:
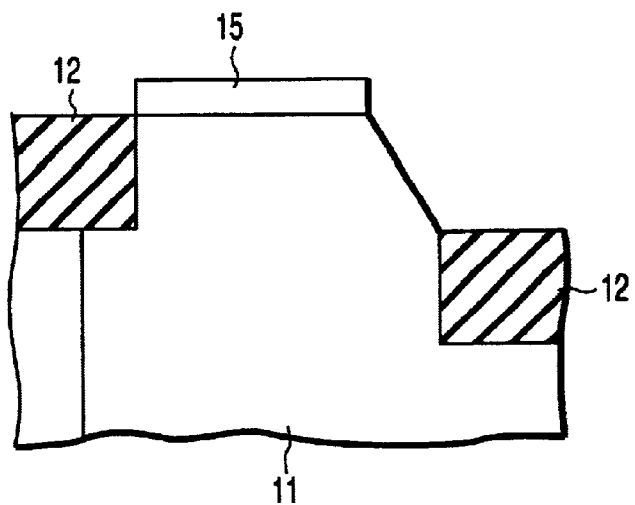
Figure 8C:
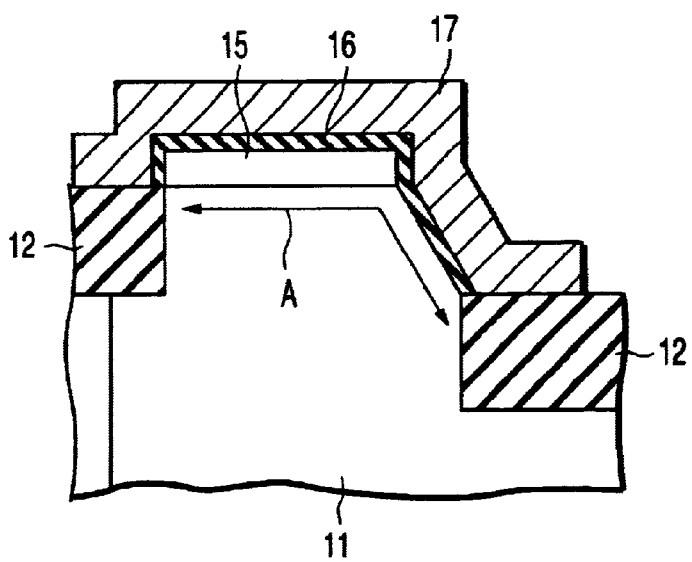

In the MOSFET according to the fourth embodiment, the channel portion of the transistor is formed to contain the silicon surface portion on the (110) surface orientation Y. However, this is not limitative and, for example, as shown in FIG. 8A to FIG. 8C, the channel portion (channel width A) of the transistor can be formed to contain the silicon surface portion on the (111) surface orientation Z in the cross section in the channel width direction.

Figure 9A:
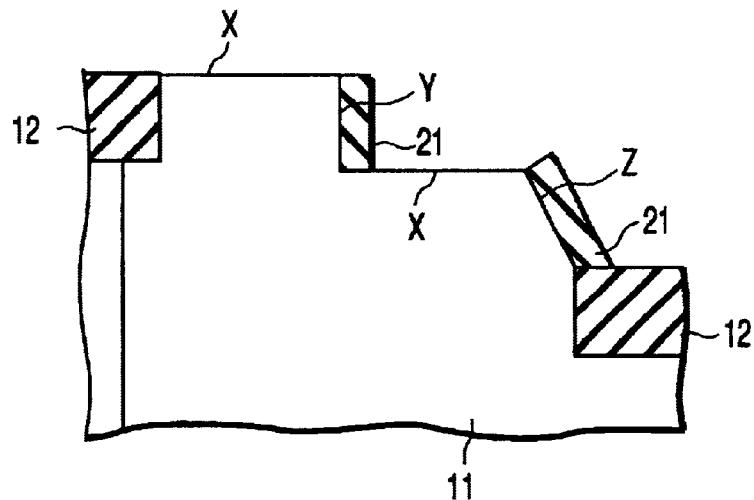
FIG. 9A to FIG. 9C are cross sectional views showing a third example of the structure, for illustrating the steps of a method for manufacturing the CMOS device according to the fourth embodiment of this invention.
Figure 9B:
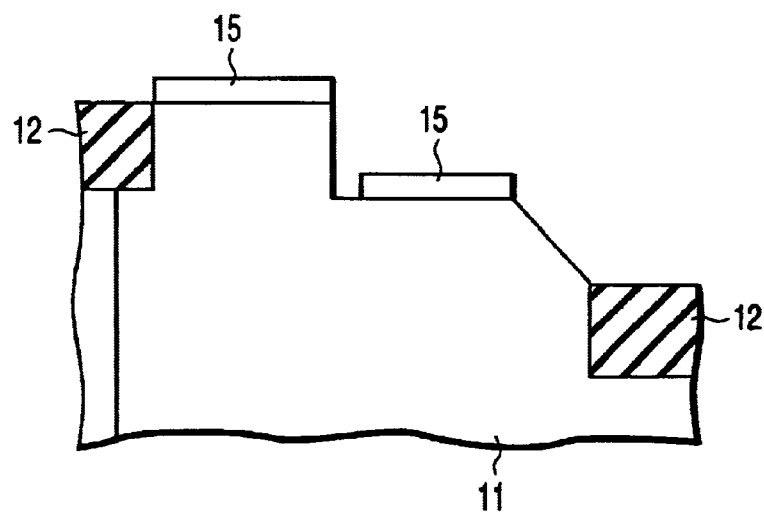
Figure 9C:
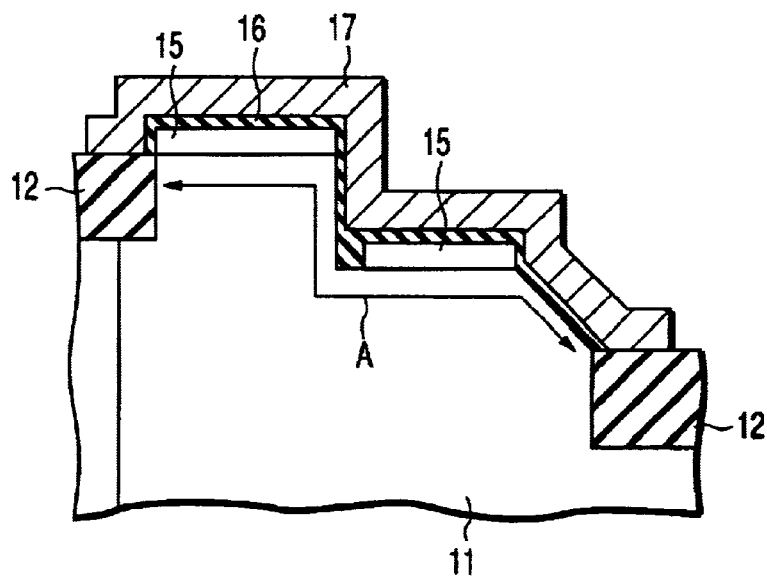

Alternatively, for example, as shown in FIG. 9A to FIG. 9C, the channel portion (channel width A) of the transistor can be formed to contain a plurality of silicon surface portions such as the silicon surface portion on the (110) surface orientation Y and the silicon surface portion on the (111) surface orientation Z in addition to the silicon surface portion on the (100) surface orientation X in the cross section in the channel width direction.

Figure 10:
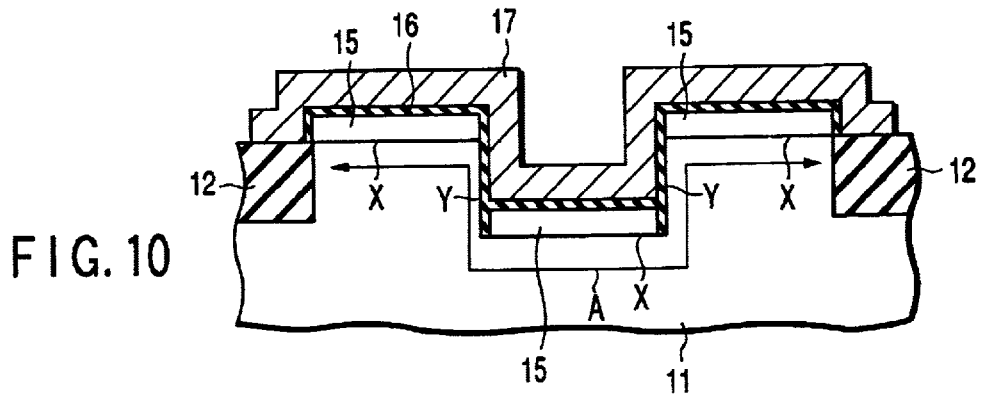
FIG. 10 is a cross sectional view showing a fourth example of the structure, for illustrating a method for manufacturing the CMOS device according to the fourth embodiment of this invention.

Further, as shown in FIG. 10, the channel portion (channel width A) of the transistor can be formed to contain a plurality of portions of the silicon surface portions of, for example, (110) surface orientation Y other than the (100) surface orientation X in the cross section in the channel width direction.

In each case of the above embodiment, the MOSFET with high reliability, small leakage current and excellent noise characteristic can be formed.

Fifth Embodiment

Figure 11A:
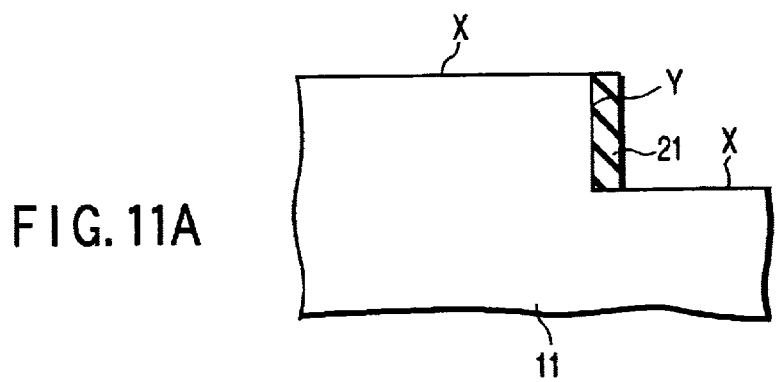
FIG. 11A to FIG. 11C are cross sectional views showing a first example of the structure, for illustrating the steps of a method for manufacturing a CMOS device according to a fifth embodiment of this invention.
Figure 11B:
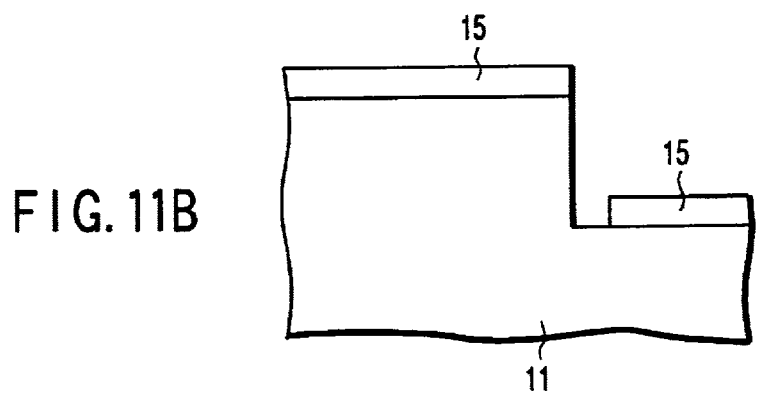
Figure 11C:
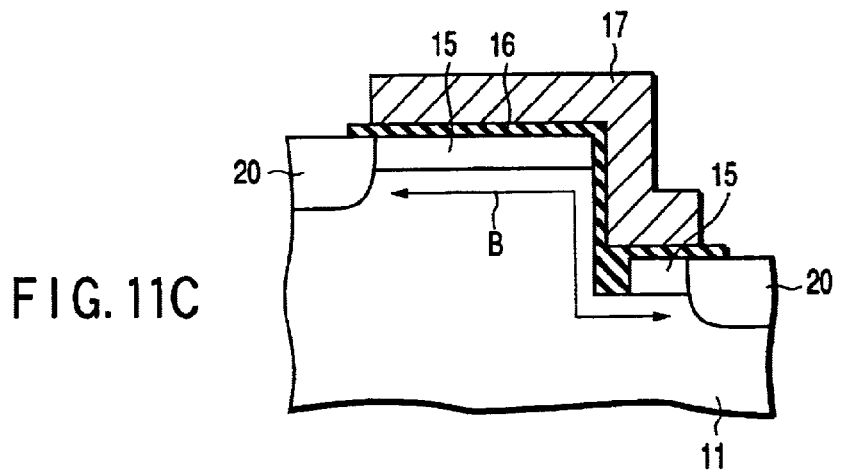

FIG. 11A to FIG. 11C show a manufacturing method of a CMOS device according to a fifth embodiment of this invention. In this example, a case wherein the channel portion of a MOSFET is so formed as to have at least a (100) surface orientation and a surface orientation other than the (100) surface orientation, for example, a (110) surface orientation on a silicon substrate in the cross section in the channel length direction is explained.

First, as shown in FIG. 11A, the surface portion of a silicon substrate 11 of (100) surface orientation X is processed by a known technique such as the silicon anisotropic etching technique to expose part of the surface portion having a surface orientation such as a (110) surface orientation Y other than the (100) surface orientation. Then, an element isolation region (not shown) is formed in the surface portion of the silicon substrate 11. In this case, a silicon surface portion used for forming the channel portion of a transistor is formed to have the (100) surface orientation X and (110) surface orientation Y in the cross section in the channel length direction.

Next, a silicon sacrificing oxide film (not shown) with a film thickness of 12 nm is formed on the surface portion of the silicon substrate 11 and then boron or arsenic which is impurity for attaining desired threshold voltage is doped into the channel portion in the case of an N-type MOSFET or a P-type MOSFET, respectively.

After this, part of the silicon sacrificing oxide film is removed so as to cover only the portion of (110) surface orientation Y of the silicon substrate 11 with a cover insulating film 21. That is, the silicon sacrificing oxide film is left behind only on the (110) surface orientation Y other than the (100) surface orientation X.

Then, a pre-heating process at 940° C. is effected as a pre-process for removing residual oxygen in the surface portion of the silicon substrate 11.

Next, as shown in FIG. 11B, a silicon epitaxial growth layer (non-doped epitaxial silicon layer) 15 is formed with a film thickness of approx. 30 nm on the silicon substrate of the (100) surface orientation X, for example, by use of $Si_2H_4Cl_2$ gas, at the temperature of 800° C. by the RP-CVD method.

After this, the cover insulating film (silicon sacrificing oxide film) 21 which covers on the silicon substrate of the (110) surface orientation Y is removed.

Then, as shown in FIG. 11C, the gate oxidation process is effected by the RTO method. By effecting the gate oxidation process, an oxide film used for forming a gate insulating film 16 with the preset film thickness is formed. For example, if the gate oxidation process is effected in a condition of the temperature of 800° C. and the oxidizing time of 10 seconds by the RTO method, an oxide film with a film thickness of 1.5 nm can be formed. If the RTO method or furnace oxidation method is used, the gate insulating film 16 with desired film thickness can be formed by adequately selecting the temperature and time.

Next, after a polysilicon film is deposited on the gate insulating film 16 to a film thickness of approx. 250 nm, the polysilicon film is patterned by anisotropic etching. Thus, a gate electrode 17 having desired gate length is formed.

Then, after preset impurity is doped, the heat treatment is effected in a nitrogen atmosphere at the temperature of 1000° C. for 20 seconds, for example, so as to diffuse and activate the doped impurity and thus form source/drain regions 20.

Thus, a MOSFET having the silicon surface portion on the (100) surface orientation X which has the silicon epitaxial growth layer 15 and the silicon surface portion on the (110) surface orientation Y which has no silicon epitaxial growth layer 15 as the channel portion thereof is completed.

Then, silicide layers (not shown) are formed on the surface portions of the source/drain regions 20 and the gate electrode 17. After thus lowering the resistance of each of the electrode portions, the electrode portions are connected to metal interconnections via contact portions.

Thus, in the case of this embodiment in which the silicon surface portions on the (100) surface orientation X and the (110) surface orientation Y are formed to be contained in the channel portion of the transistor, a portion indicated by a range B becomes almost equal to the channel length in the cross section in the channel length direction.

Figure 12A:
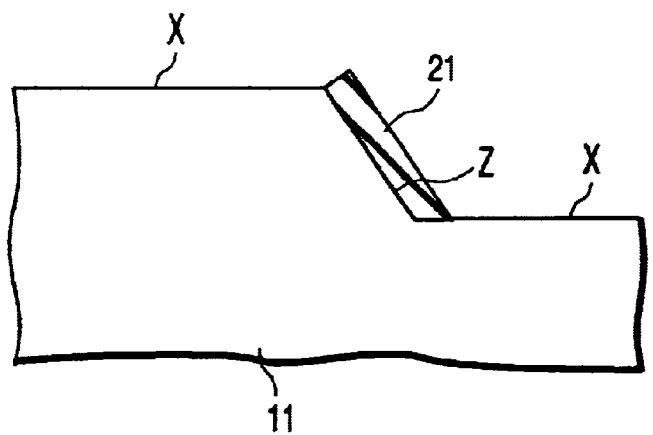
FIG. 12A to FIG. 12C are cross sectional views showing a second example of the structure, for illustrating the steps of a method for manufacturing the CMOS device according to the fifth embodiment of this invention.
Figure 12B:
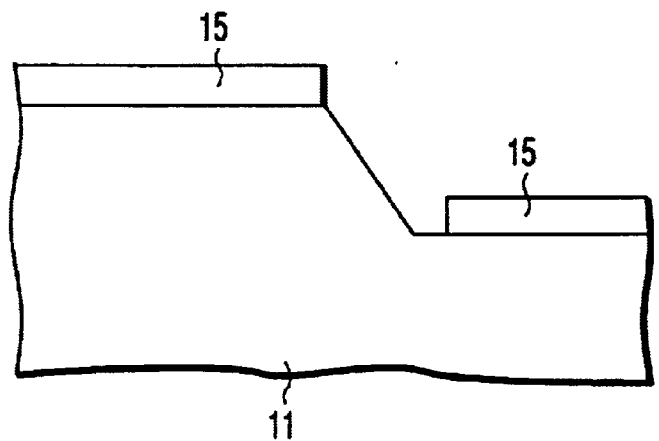
Figure 12C:
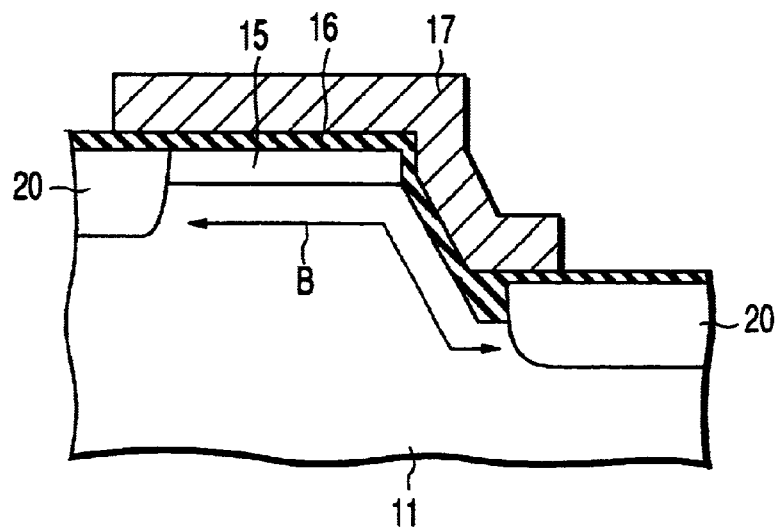

In the MOSFET according to the fifth embodiment, the channel portion of the transistor is formed to contain the silicon surface portion on the (110) surface orientation Y. However, this is not limitative and, for example, as shown in FIG. 12A to FIG. 12C, the channel portion (channel length B) of the transistor can be formed to contain the silicon surface portion on the (111) surface orientation z in the cross section in the channel length direction.

Figure 13A:
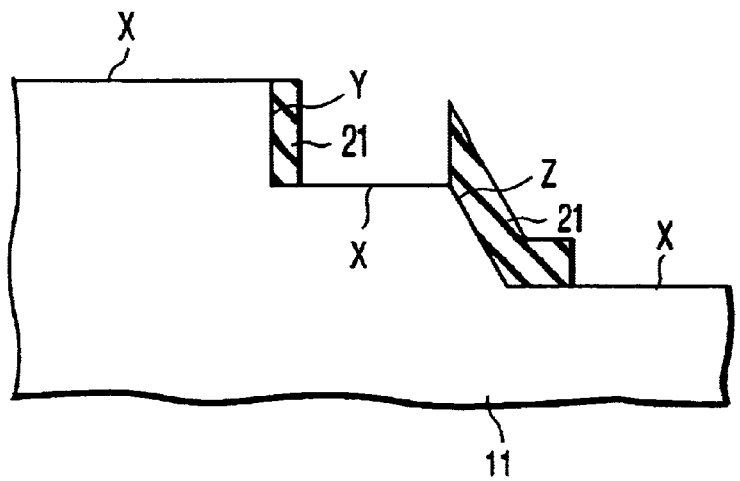
FIG. 13A to FIG. 13C are cross sectional views showing a third example of the structure, for illustrating the steps of a method for manufacturing the CMOS device according to the fifth embodiment of this invention.
Figure 13B:
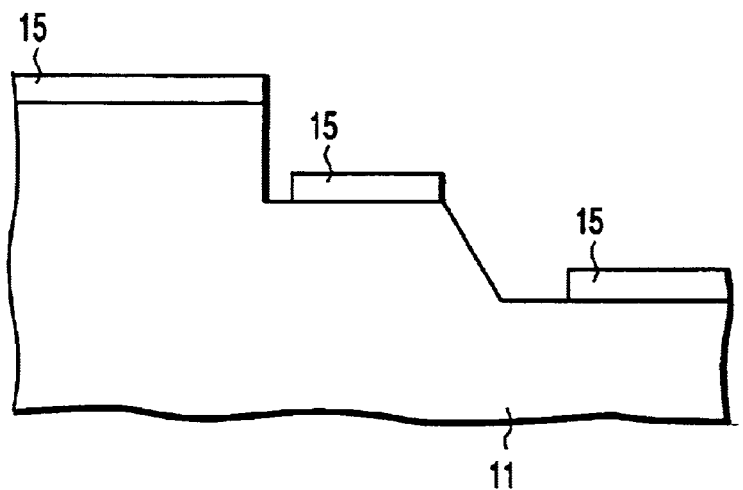
Figure 13C:
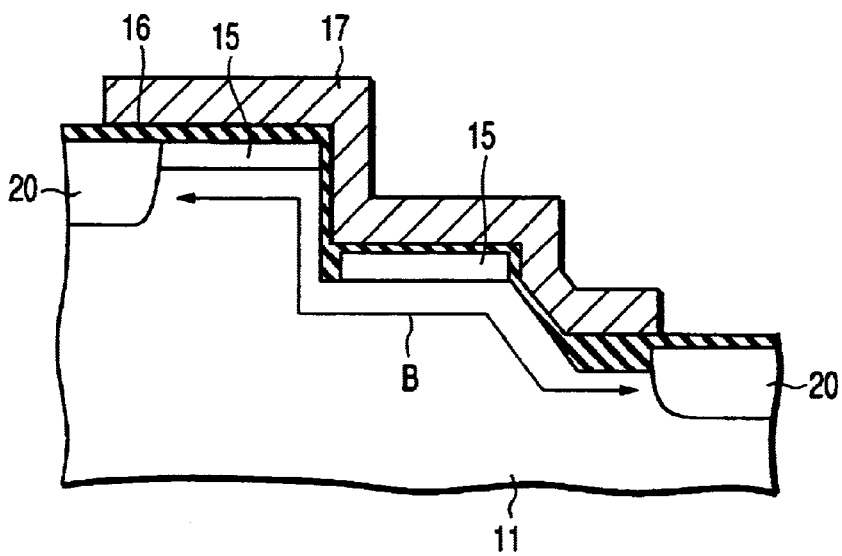

Alternatively, for example, as shown in FIG. 13A to FIG. 13C, the channel portion (channel length B) of the transistor can be formed to contain a plurality of silicon surface portions such as the silicon surface portion on the (110) surface orientation Y and the silicon surface portion on the (111) surface orientation Z in the cross section in the channel length direction.

Figure 14:
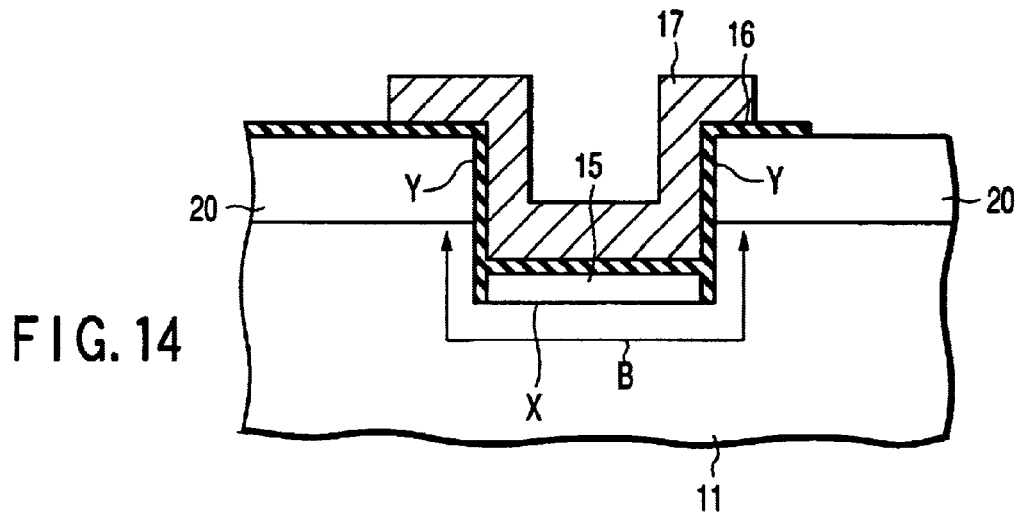
FIG. 14 is a cross sectional view showing a fourth example of the structure, for illustrating a method for manufacturing the CMOS device according to the fifth embodiment of this invention.

Further, as shown in FIG. 14, the channel portion (channel length B) of the transistor can be formed to contain a plurality of portions of the silicon surface portions, for example, on the (110) surface orientation Y other than the (100) surface orientation X in the cross section in the channel length direction.

In each case of the above embodiment, the MOSFET with high reliability, small leakage current and excellent noise characteristic can be formed.

In each of the first to fifth embodiments, a case wherein the (110) or (111) surface orientation is used as the surface orientation other than the (100) surface orientation is explained. However, the surface orientation is not limited to the above case and, for example, if (113), (115) surface orientations on which the silicon growth rate is known to be lower than on the (100) surface orientation or other surface orientations such as (211), (311), (511), (811), (101), (011) surface orientations are used, the above effect can be expected.

Further, in each of the above embodiments, the silicon substrate (wafer) of (100) surface orientation is used and a surface orientation other than the (100) surface orientation is intentionally formed on the surface portion thereof. However, the same operation can be effected in the same manner with respect to the silicon substrate of the surface orientation other than the (100) surface orientation, for example. That is, in the silicon substrate of the surface orientation other than the (100) surface orientation, the silicon substrate of (100) surface orientation is exposed by anisotropic etching or chemical etching and then a silicon epitaxial growth layer may be formed in the channel portion forming region of a transistor on the exposed surface.

Further, a method for forming the silicon epitaxial growth layer is not limited to the reduced pressure chemical vapor deposition method and, for example, the silicon epitaxial growth layer can be formed by use of a low pressure chemical vapor deposition (UHV-CVD) method. Further, gas used in this case is not limited to $Si_2H_4Cl_2$, and $Si_2H_6$, $SiHCl_4$, $SiH_4$, or a mixture gas of the above gas and $H_2$ or HCL can be used.

Further, in each of the above embodiments, the silicon epitaxial growth layer was formed to the film thickness of 30 nm. The effect can be attained if a silicon epitaxial growth layer with at least a film thickness of 0.2 nm is used as the silicon epitaxial growth layer 15, and if a silicon epitaxial growth layer of larger film thickness is used, the effect of making the surface flat and reducing the gate leakage current becomes more significant. However, in order to suitably control the switching characteristic of the transistor by use of the gate electrode, it is preferable to set the film thickness of the silicon epitaxial growth layer up to approx. 70 nm.

Further, in each of the first to fifth embodiments, a case wherein the epitaxial growth layer was mainly formed of silicon was explained. However, this is not limitative and the same effect can be expected even if a layer mainly formed of a mixture of silicon and germanium is used.

Sixth Embodiment

Further, it is preferable to form a gate insulating film thinner than the gate insulating film of a MOSFET having a channel/gate insulating film interface on a (100) surface orientation as the gate insulating film of a MOSFET having a channel/gate insulating film interface on a surface orientation other than the (100) surface orientation. Particularly, in a MOSFET formed on a (111) surface orientation, for example, it is preferable to set the film thickness expressed in terms of the equivalent oxide thickness to 2.5 nm or less or when the gate insulating film is formed with a stacked film structure, it is preferable to set the film thickness of an insulating film formed in contact with the silicon substrate to 2.5 nm or less.

Equivalent oxide thickness of the gate insulating film means a thickness of $SiO_2$ (oxide) whose capacitance is equal to the capacitance of the gate insulating film.

Figure 15A:
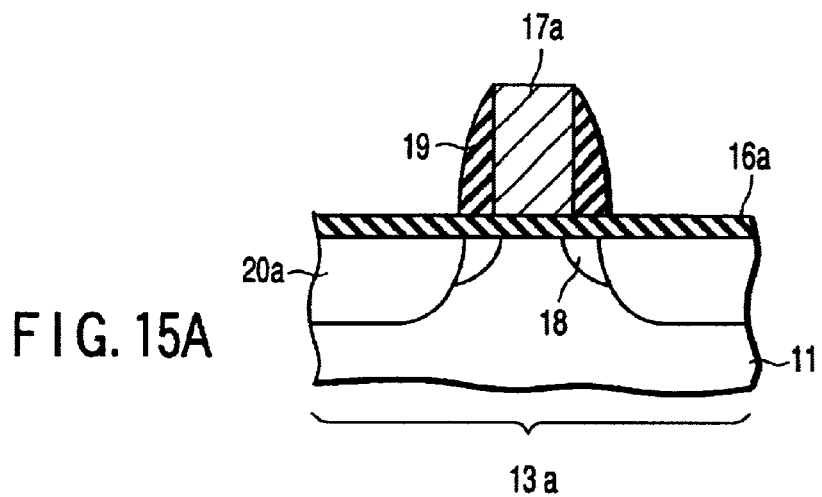
FIG. 15A and FIG. 15B are cross sectional views showing examples of gate insulating films of MOSFETs according to a sixth embodiment of this invention.
Figure 15B:
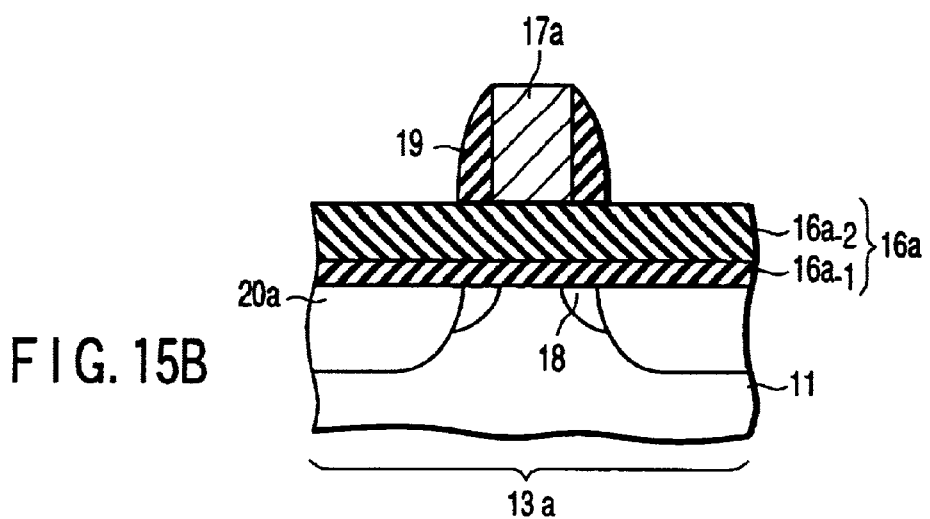

Now, the film thickness of the gate insulating films of MOSFETs according to a sixth embodiment is explained with reference to FIG. 15A and FIG. 15B. FIG. 15A shows an example of the gate insulating film with a single film structure and FIG. 15B shows an example of the gate insulating film with a stacked film structure.

In FIG. 15A, a gate insulating film 16a is formed with a thickness of not larger than 2.5 nm at least on a (111) surface orientation (N-well region 13a) of a silicon substrate 11 by the gate oxidation process by use of the RTO method.

As described before, if the gate oxidation process is effected in a condition of the temperature of 800° C. and the oxidizing time of 10 seconds by the RTO method, an oxide film (Pure oxide) with a film thickness of 1.5 nm can be formed as shown in Table 2 as will be described later. Thus, if the RTO method is used, the gate insulating film 16a with desired film thickness not larger than 2.5 nm can be formed on the substrate of the (111) surface orientation by adequately selecting the temperature and time.

TABLE 2

| | | | (100) | | (111) | |
|---|---|---|---|---|---|---|
| | | | av. (nm) | σ (%) | av. (nm) | σ (%) |
| Pure oxide | RTO | 700° C., $O_2$10%, 2S | 1.29 | 0.90 | 1.16 | 0.86 |
| | | 800° C., $O_2$50%, 1S | 1.36 | 0.98 | 1.32 | 0.85 |
| | | 800° C., $O_2$100%, 10S | 1.54 | 0.83 | 1.47 | 0.72 |
| | | 800° C., $O_2$100%, 30S | 1.81 | 0.86 | 1.74 | 0.81 |
| | | 800° C., $O_2$100%, 120S | 2.14 | 0.83 | 2.03 | 0.72 |
| | Furnace | 850° C., $O_2$ | 2.98 | 0.57 | 3.63 | 1.06 |
| Oxynitride | RTO | (800° C., $O_2$50%, 1s) + | 2.22 | 0.38 | 2.14 | 0.38 |
| | Furnace | (800° C., NO10%, 30 m) | | | | |

As shown in FIG. 15B, a gate insulating film 16a is formed with a stacked film structure of a silicon oxide film (insulating film) $16a_{-1}$ and ferroelectric film $16a_{-2}$, for example. In this case, as described above, the silicon oxide film $16a_{-1}$ is formed with the thickness of not larger than 2.5 nm at least on the (111) surface orientation (N-well region 13a) of a silicon substrate 11 by the gate oxidation process by use of the RTO method. Then, the ferroelectric film $16a_{-2}$ formed of $Al_2O_3$, for example, is stacked on the silicon oxide film $16a_{-1}$ to form the gate insulating film 16a.

Thus, in the MOS transistor (MOSFET) formed on the silicon substrate of the (111) surface orientation other than the (100) surface orientation and having the film thickness of the gate insulating film adequately controlled, the state of the interface between the silicon substrate 11 and the gate insulating film 16a can be improved in comparison with a case wherein the gate insulating film is thick, and as a result, the transistor performance can be significantly enhanced.

FIG. 16 shows a variation in the film thickness of an oxide film in the wafer surface by use of, for example, an 8-inch wafer by taking the (100) surface orientation and (111) surface orientation as an example for comparison.

As is clearly seen from FIG. 16, the characteristic is better in the case of the (100) surface orientation when the film thickness Tox of the oxide film is larger than approx. 2.0 to 2.5 nm and the characteristic becomes better in the case of the (111) surface orientation when the film thickness Tox is smaller than approx. 2.0 to 2.5 nm. Particularly, in the case of the (111) surface orientation, it is understood that a variation a (Tox) in the film thickness in the wafer surface is enhanced if the film thickness Tox of the oxide film is smaller than 2.5 nm.

FIG. 17 shows variations in the transconductance Gm and threshold voltage Vth of an N-type MOSFET in the wafer surface by taking a transistor on an 8-inch wafer of (100) surface orientation and a transistor on an 8-inch wafer of (111) surface orientation as an example for comparison.

As is also clearly seen from FIG. 17, the characteristic is better in the case of the (100) surface orientation when the film thickness Tox of the oxide film is larger than approx. 2.0 to 2.5 nm and the characteristic becomes better in the case of the (111) surface orientation when the film thickness Tox is smaller than approx. 2.0 to 2.5 nm. Particularly, in the case of the 8-inch wafer of (111) surface orientation, it is understood that a variation in the transistor performance can be extremely suppressed in comparison with the case of large film thickness (5 nm) if the film thickness of the oxide film is smaller than 2.5 nm.

Figure 18A:
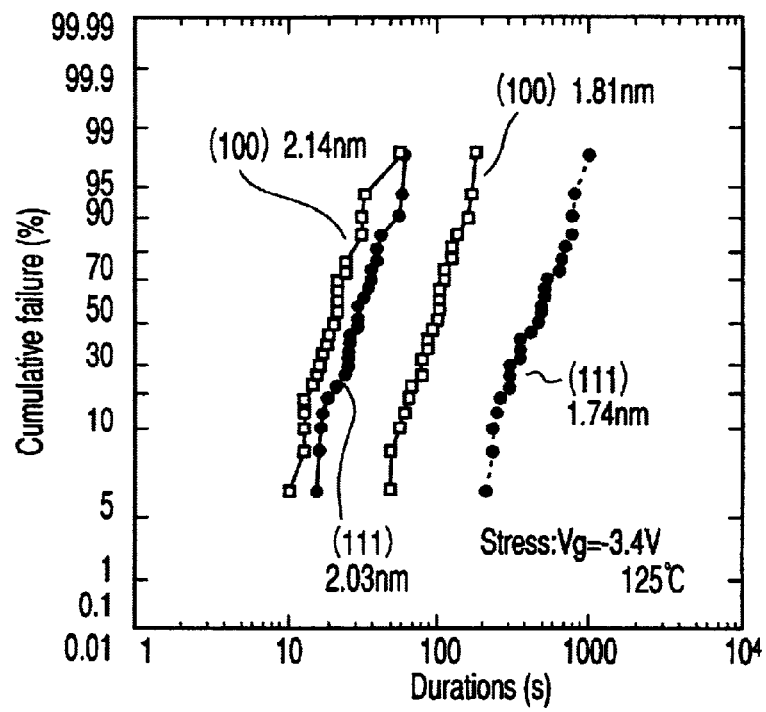
FIG. 18A and FIG. 18B are characteristic diagrams for illustrating the reliability of a MOS capacitor used as an example according to this invention.
Figure 18B:
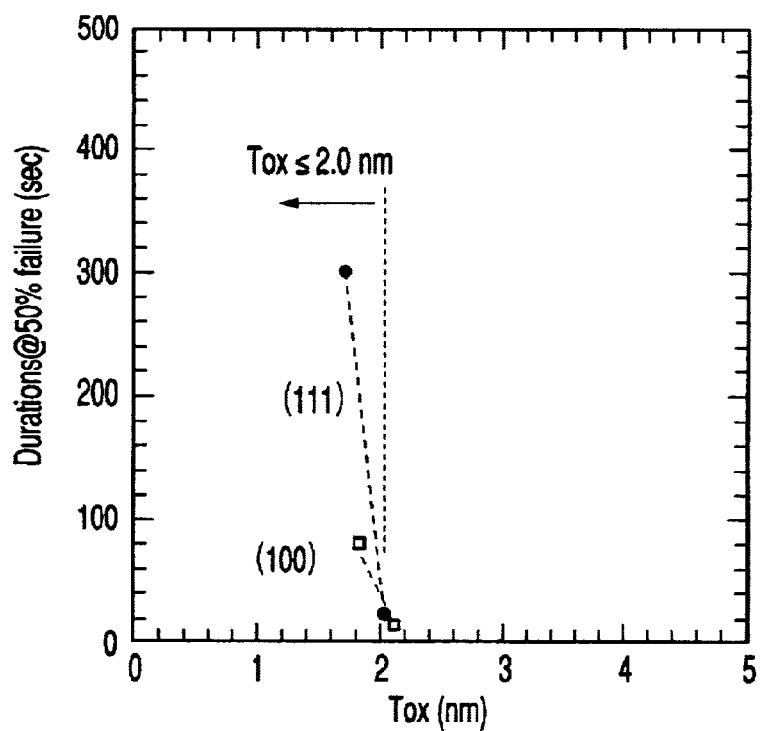

FIGS. 18A and 18B illustrate the TDDB (Time Dependent Dielectric Breakdown) reliability of a MOS capacitor formed on an 8-inch wafer of (111) surface orientation, for example, in comparison with that of a MOS capacitor formed on a wafer of (100) surface orientation. FIG. 18A shows a variation of the film thickness of an oxide film in the wafer surface and FIG. 18B shows the dependency on the film thickness of an oxide film.

When the film thickness Tox of the oxide film becomes smaller than approx. 2.0 to 2.5 nm, it is understood that the TDDB reliability of the MOS capacitor on the wafer of (111) surface orientation can be extremely enhanced in comparison with that of the MOS capacitor on the wafer of (100) surface orientation if the oxidation process is effected under the same condition.

Likewise, in the case of the transistor on the wafer of (111) surface orientation, a transistor with higher reliability can be attained if the film thickness of the oxide film is made equal to or smaller than 2.0 nm.

Figure 19A:
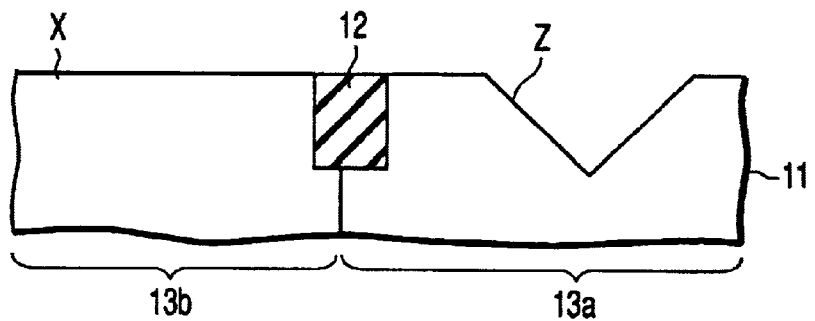
FIG. 19A to FIG. 19C are cross sectional views for illustrating the steps of a method for manufacturing the CMOS device according to this invention in which a MOSFET having a thick gate oxide film formed on a substrate of a (100) surface orientation and a MOSFET having a thin gate oxide film formed on the substrate of a (111) surface orientation are formed.
Figure 19B:
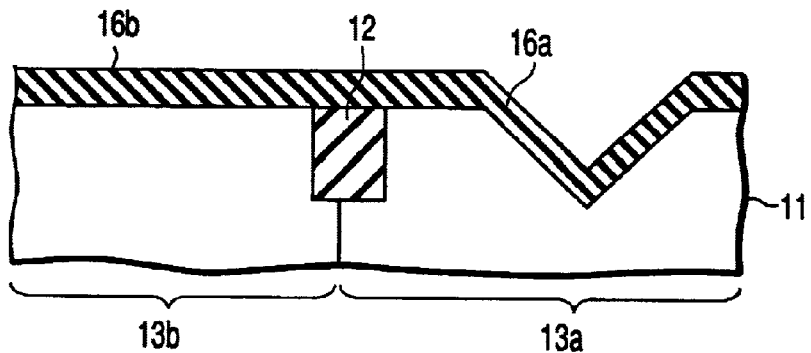
Figure 19C:
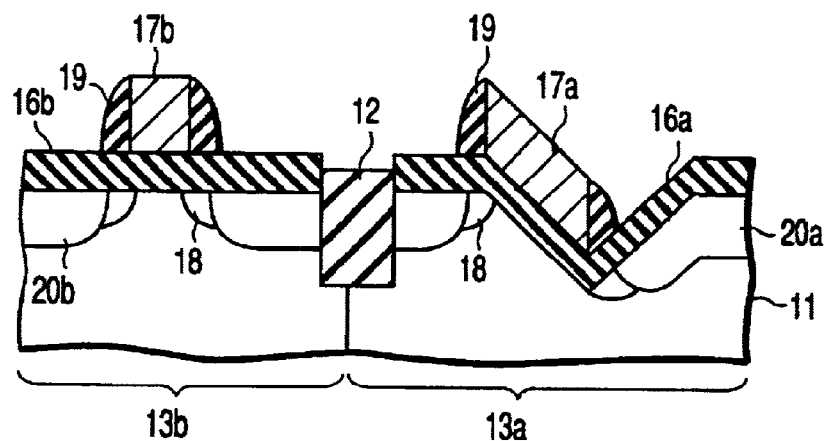

FIG. 19A to FIG. 19C show cases wherein a MOSFET having a thick gate oxide film 16b formed on a substrate of a (100) surface orientation X and a MOSFET having a thin gate oxide film 16a formed on the substrate of a (111) surface orientation Z are formed.

In this case, transistors with higher performance and higher reliability can be attained on the substrate of both of the (100) surface orientation X and (111) surface orientation Z.

The gate oxide films 16a, 16b on the (100) surface orientation X and (111) surface orientation Z can be formed to respectively have desired film thickness by effecting the oxidation step twice. Alternatively, as shown in Table 2 and FIGS. 20A and 20B, if the film thickness is smaller than approx. 2.2 nm, it is possible to simultaneously form an oxide film on the substrate of the (100) surface orientation X and an oxide film on the substrate of the (111) surface orientation z which is thinner than the former oxide film by effecting the oxidation step only once.

Figure 20A:
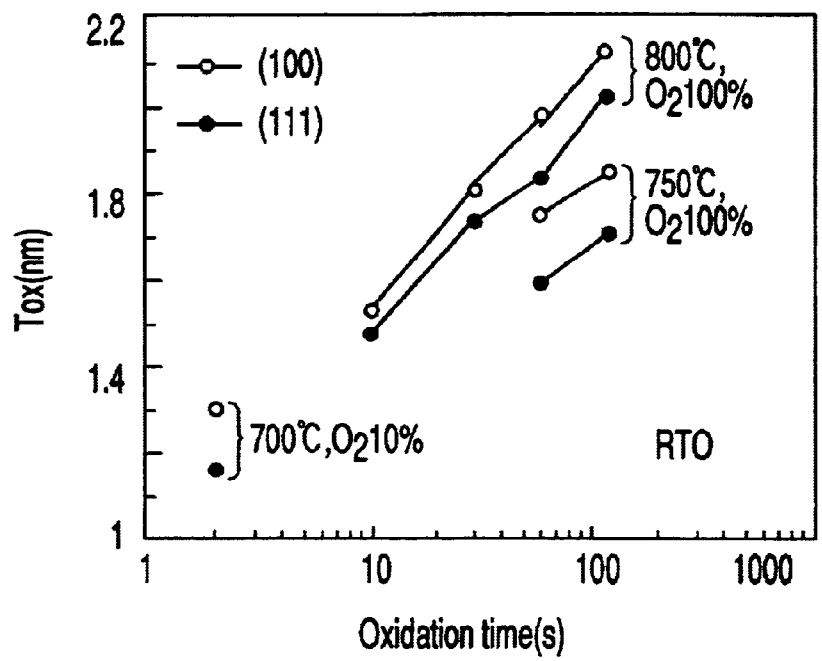
FIG. 20A and 20B are characteristic diagrams for illustrating the relation between the surface orientation and a silicon oxide film in this invention.
Figure 20B:
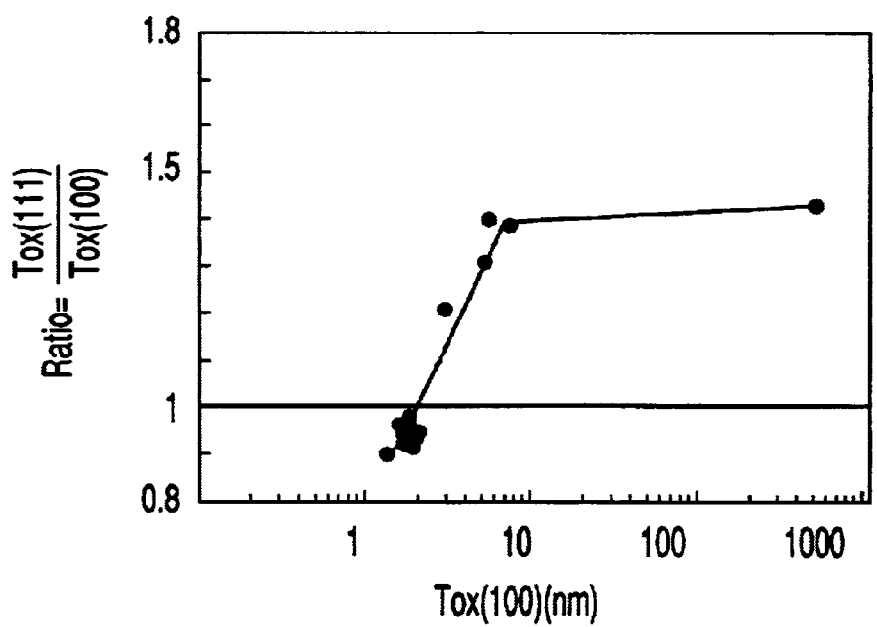
Figure 21A:
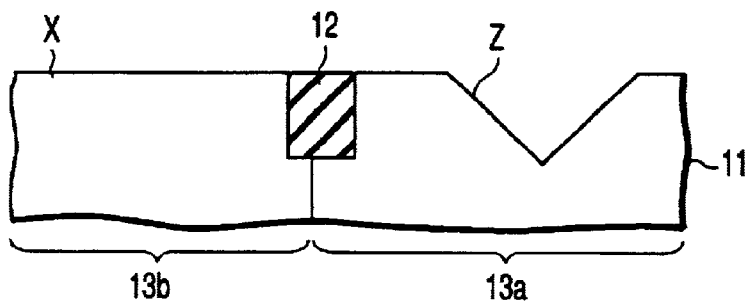
FIG. 21A to FIG. 21D are cross sectional views showing the manufacturing steps of a CMOS device according to this invention in which MOSFETs each having a gate insulating film formed of a stacked film are formed on a substrate of (100) and (111) surface orientations, for example.
Figure 21B:
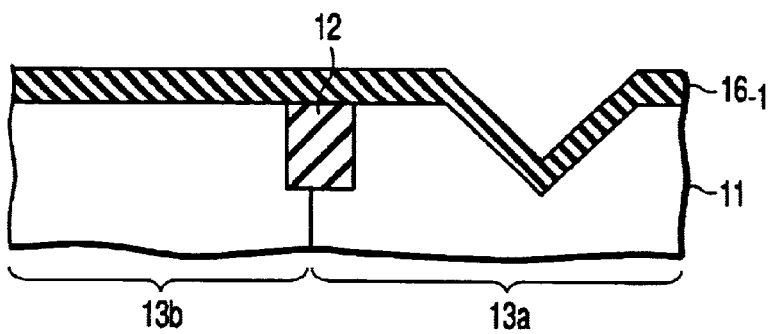
Figure 21C:
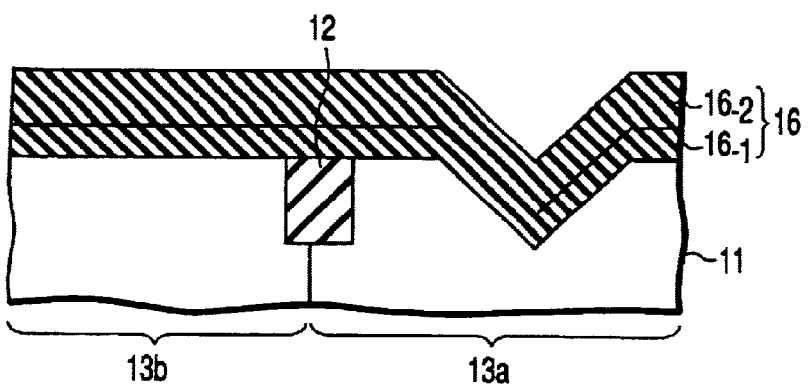
Figure 21D:
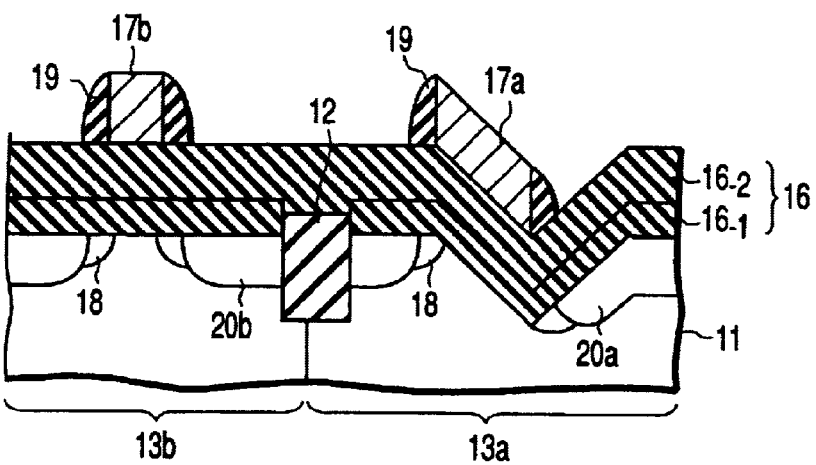
Figure 22A:
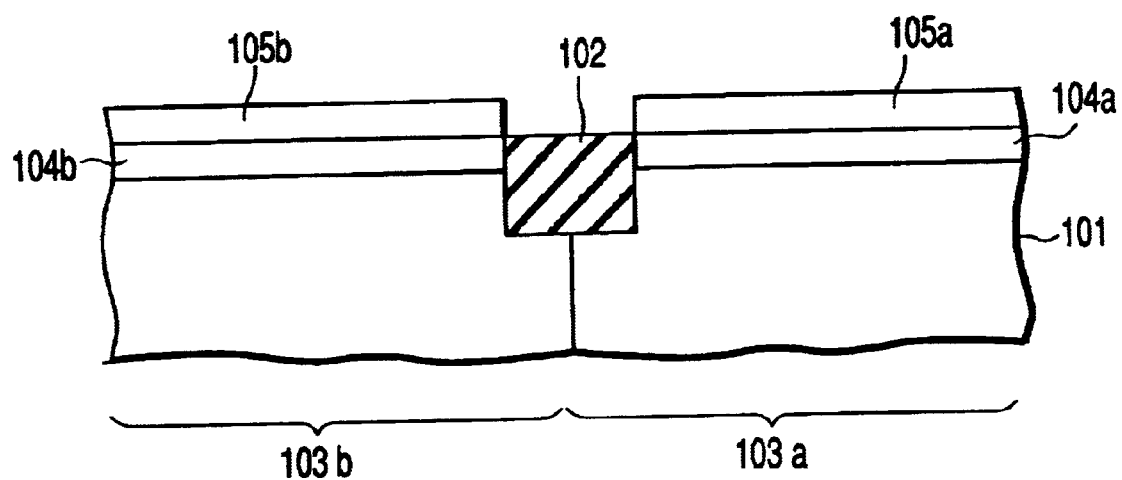
FIG. 22A and FIG. 22B are cross sectional views showing the manufacturing steps of a CMOS device, for illustrating the prior art and a problem thereof.
Figure 22B:
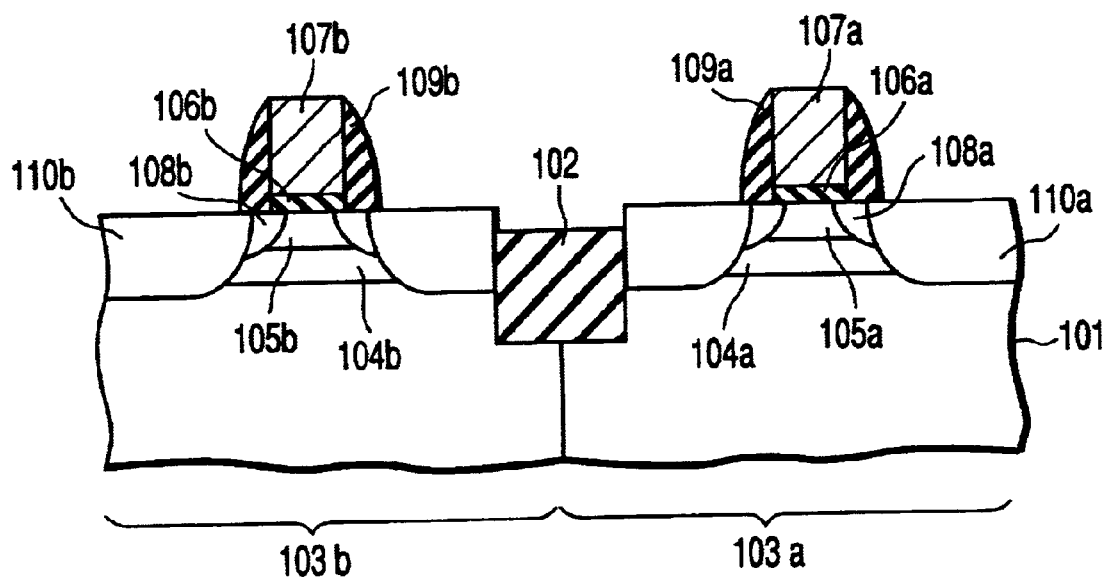

Incidentally, FIG. 20A shows the relation between the oxidation rate and the oxide film thickness of silicon oxide films formed on the substrate of the (100), (111) surface orientations and FIG. 20B shows the ratio of the oxide film thicknesses of silicon oxide films formed on the substrate of the (100), (111) surface orientations (in the same oxidation condition).

FIG. 21A to FIG. 21D show a case wherein MOSFETs each having a gate insulating film 16 formed of stacked films $16_{-1}$, $16a_{-2}$ are respectively formed on a substrate of (100) and (111) surface orientations, for example.

In this case, the gate insulating film 16 is formed by laminating the ferroelectric film $16_{-2}$ on the silicon oxide film $16_{-1}$, for example.

In the MOSFETs shown in FIG. 15A and FIG. 19A to FIG. 19C, the gate insulating film $16_a$ is not limited to the oxide film. For example, a silicon nitride film, silicon oxynitride film, or a stacked film thereof can be used and if the film is so formed as to have the film thickness of not larger than 2.5 nm, preferably, not larger than 2.0 nm expressed in terms of the equivalent oxide thickness, the same effect can be attained.

In the case of the silicon nitride film, since it has a dielectric constant which is approx. twice that of the silicon oxide film, the same effect can be attained by setting the film thickness thereof to 5 nm or less.

In the case of the silicon oxynitride film, it has a dielectric constant lying between those of the oxide film and the nitride film and corresponding to the concentration of nitrogen contained therein. Therefore, the upper limit of the film thickness becomes 2.5 nm to 5.0 nm according to the concentration of nitrogen contained therein and the same effect can be attained if the film thickness is smaller than the film thickness corresponding to the concentration of nitrogen contained therein. That is, the dielectric constant $\epsilon_{SiON}$ of the silicon oxynitride film can be estimated based on the composition ratio of nitrogen and oxygen in the insulating film by use of the following equation (1).

$$\epsilon_{SiON} = (1-X)\epsilon_{SiO_2} + X\epsilon_{Si_3N_4} \tag{1}$$

where x indicates the ratio of $Si_3N_4$ to SiON in the silicon oxynitride film.

Since the dielectric constant $\epsilon_{SiO_2}$ of the silicon oxide film is approx. 3.9 and the dielectric constant $\epsilon_{Si_3N_4}$ of the silicon nitride film is approx. 7.9, the dielectric constant $\epsilon_{SiON}$ of the silicon oxynitride film is derived by use of the following equation (2).

$$\epsilon_{SiON} = 3.9 + 4x, \; 0 < x < 1 \tag{2}$$

Since the film thickness of the insulating film for attaining the effect of this invention is 2.5 nm or less when it is expressed in terms of the equivalent oxide thickness, the same effect can be attained by setting the film thickness of 2.5(3.9+4x)/3.9 nm or less according to the concentration of nitrogen contained therein in the case of a silicon oxynitride film.

Particularly, when the silicon oxynitride film is used, a variation in the film thickness becomes smaller than that in the oxide film (refer to Table 2). Therefore, a transistor with higher performance and higher reliability can be attained.

In the MOSFETS shown in FIG. 15B and FIG. 21A to FIG. 21D, the gate insulating films 16a, 16 are not limited to the stacked structure of the silicon oxide film $16_{-1}$ and ferroelectric film $16_{-2}$. That is, instead of the silicon oxide film $16_{-1}$, a silicon nitride film, silicon oxynitride film or a stacked structure thereof can be used, for example, and the same effect as that described above can be attained if the film thickness expressed in terms of the equivalent oxide thickness is 2.5 nm or less, preferably, 2.0 nm or less.

Likewise, as the ferroelectric film $16_{-2}$, for example, a silicate film of $HfO_2$—$SiO_2$, $ZrO_2$—$SiO_2$, $2La_2O_3$—$SiO_2$, $Gd_2O_3$—$SiO_2$ or a film of $Si_3N_4$, $Ta_2O_5$, $Sc_2O_3$, $Y_2O_3$, $Gd_2O_3$, $La_2O_3$, $ZrO_2$, $LaAlO_3$, $ZrTiO_4$, $HfO_2$, $SrZrO_3$, $HfxSnyTizO$, $ZrxSnyTizO$, $TiO_2$, $SrTiO_3$, $SrBi_2Ta_2O_9$, $BaxSrl$—$xTiO_3$, PZT having an insulating property can be used instead of $Al_2O_3$ and the same effect can be expected in each case.

Particularly, in the case of the gate insulating film 16 of the stacked film structure, the upper level layer thereof is not limited to the single-layered film such as the ferroelectric film $16_{-2}$. For example, in order to improve the characteristic with respect to the gate electrode interface, enhance the reliability thereof and reduce the leakage current, the film can be formed by stacking films of two or more layers of different materials and, also in this case, the same effect can be expected.

In the sixth embodiment, a case wherein the (111) surface orientation is set as the surface orientation other than the (100) surface orientation is explained. However, this is not limitative and the same effect can be expected when the surface orientation of (110), (113), (115) or (211), (311), (511), (811), (101), (011) is used.

Particularly, if part of the channel portion of the P-type MOSFET which is formed in contact with the gate insulating film is formed on the substrate of the (110), (111) surface orientation, the channel mobility is enhanced. In the case of the N-type MOSFET, if part of the channel portion which is formed in contact with the gate insulating film is formed on the substrate of the (100) surface orientation, the channel mobility is enhanced. As a result, a CMOS device with high performance can be attained. At this time, a silicon epitaxial growth layer may be formed or may not be formed on that part of the channel portion of the N-type MOSFET which is formed in contact with the gate insulating film.

In this embodiment, a case wherein the channel portion of the N-type MOSFET is formed on the substrate of the (100) surface orientation and the channel portion of the P-type MOSFET is formed on the substrate of the surface orientation other than the (100) surface orientation is explained. In this case, the excellent mobility can be attained in each of the N-type MOSFET and P-type MOSFET and a CMOS device with high reliability, small leakage current and excellent noise characteristic can be formed.

Further, in a case where MOSFETs of the same conductivity type are formed on the substrate of the (100) surface orientation and the surface orientation different from the (100) surface orientation (for example, when N-type MOSFETs are formed on the substrate of both of the surface orientations or when P-type MOSFETs are formed on the substrate of both of the surface orientations), MOSFETs with high reliability, small leakage current and excellent noise characteristic can be formed in the same manner. In this case, since the film thickness of the gate insulating film of the MOSFET on the substrate of the (100) surface orientation and the film thickness of the gate insulating film of the MOSFET on the substrate of the surface orientation different from the (100) surface orientation are different from each other, MOSFETs of the same conductivity type having different threshold voltages and different driving powers can be formed.

According to the semiconductor device of this invention, the characteristic of the MOSFET formed on the silicon surface orientation other than the (100) silicon surface orientation can be improved. As a result, MOSFETs which have extremely high performance, high reliability, small leakage current and excellent noise characteristic can be formed on the same silicon substrate while the advantages of each transistor formed on various silicon surface orientations can be maintained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device including field effect transistors each of which has a gate electrode formed on a semiconductor substrate with a gate insulating film disposed therebetween, a semiconductor layer opposite to the gate electrode forming a channel forming region, and source and drain regions formed on both sides of the channel forming region, comprising:

a first field effect transistor in which a surface portion of the channel forming region formed in contact with the gate insulating film is formed on a (100) silicon surface orientation; and a second field effect transistor in which a surface portion of the channel forming region formed in contact with the gate insulating film is formed on a (111) silicon surface orientation;

wherein the film thickness of the gate insulating film of the second field effect transistor is smaller than the film thickness of the gate insulating film of the first field effect transistor.

2. The semiconductor device according to claim 1, wherein the film thickness of the gate insulating film of the second field effect transistor is not larger than 2.0 nm.

3. A semiconductor device including field effect transistors each of which has a gate electrode formed on a semiconductor substrate with a gate insulating film disposed therebetween, a semiconductor layer opposite to the gate electrode forming a channel forming region, and source and drain regions formed on both sides of the channel forming region, comprising:

a first field effect transistor in which a surface portion of the channel forming region formed In contact with the gate insulating film is formed on a (100) silicon surface orientation; and a second field effect transistor in which a surface portion of the channel forming region formed in contact with the gate insulating film is formed on a (111) silicon surface orientation;

wherein the gate insulating film of the first field effect transistor is constructed as a stacked film of a first insulating film formed in contact with the channel forming region and a second insulating film formed of a material or composition different from the first insulating film, the gate insulating film of the second field effect transistor is constructed as a stacked film of a third insulating film formed in contact with the channel forming region and a fourth insulating film formed of a material or composition different from the third insulating film, and the film thickness of the third insulating film is smaller than the film thickness of the first insulating film.

* * * * *